(12) United States Patent
Tien et al.

(10) Patent No.: US 12,424,488 B2
(45) Date of Patent: Sep. 23, 2025

(54) DUAL ETCH-STOP LAYER STRUCTURE

(71) Applicant: Taiwan Semiconductor Manufacturing Company, Ltd., Hsinchu (TW)

(72) Inventors: Hsi-Wen Tien, Xinfeng Township (TW); Wei-Hao Liao, Taichung (TW); Yu-Teng Dai, New Taipei (TW); Hsin-Chieh Yao, Hsinchu (TW); Chih Wei Lu, Hsinchu (TW); Chung-Ju Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/500,370

(22) Filed: Nov. 2, 2023

(65) Prior Publication Data
US 2024/0063057 A1 Feb. 22, 2024

Related U.S. Application Data

(63) Continuation of application No. 17/337,775, filed on Jun. 3, 2021, now Pat. No. 11,842,924.

(51) Int. Cl.
*H01L 21/768* (2006.01)
*H01L 23/522* (2006.01)

(52) U.S. Cl.
CPC .. *H01L 21/76831* (2013.01); *H01L 21/76802* (2013.01); *H01L 21/76832* (2013.01); *H01L 23/5226* (2013.01)

(58) Field of Classification Search
CPC ......... H01L 21/76831; H01L 21/76802; H01L 21/76832; H01L 23/5226; H01L 21/76811; H01L 21/76883; H01L 21/76897; H01L 23/53295; H01L 21/76834; H01L 21/76877
See application file for complete search history.

(56) References Cited

U.S. PATENT DOCUMENTS

| | | | | |
|---|---|---|---|---|
| 8,765,604 | B2 * | 7/2014 | Vannier | H01L 21/76849 438/666 |
| 2020/0006638 | A1 * | 1/2020 | Chen | H10N 50/10 |
| 2020/0219808 | A1 * | 7/2020 | Hwang | H01L 21/76832 |
| 2022/0102343 | A1 * | 3/2022 | Mule' | H01L 23/5384 |

OTHER PUBLICATIONS

Non-Final Office Action dated Apr. 26, 2023 for U.S. Appl. No. 17/337,775.
Notice of Allowance dated Aug. 9, 2023 for U.S. Appl. No. 17/337,775.

* cited by examiner

*Primary Examiner* — Karen Kusumakar
(74) *Attorney, Agent, or Firm* — Eschweiler & Potashnik, LLC

(57) ABSTRACT

The present disclosure relates to an integrated chip including a substrate. A first conductive wire is within a first dielectric layer that is over the substrate. A first etch-stop layer is over the first dielectric layer. A second etch-stop layer is over the first etch-stop layer. A conductive via is within a second dielectric layer that is over the second etch-stop layer. The conductive via extends through the second etch-stop layer and along the first etch-stop layer to the first conductive wire. A first lower surface of the second etch-stop layer is on a top surface of the first etch-stop layer. A second lower surface of the second etch-stop layer is on a top surface of the first conductive wire.

20 Claims, 15 Drawing Sheets

DUAL ETCH-STOP LAYER STRUCTURE

REFERENCE TO RELATED APPLICATION

This application is a Continuation of U.S. application Ser. No. 17/337,775, filed on Jun. 3, 2021, the contents of which are hereby incorporated by reference in their entirety.

BACKGROUND

Modern day integrated chips contain millions of semiconductor devices. The semiconductor devices are electrically interconnected by way of back-end-of-the-line (BEOL) metal interconnect layers that are formed above the devices on an integrated chip. A typical integrated chip comprises a plurality of back-end-of-the-line metal interconnect layers including different sized metal wires vertically coupled together with metal contacts (i.e., vias). A typical integrated chip also comprises a plurality of dielectric layers that electrically isolate some of the metal wires and/or vias from one another.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
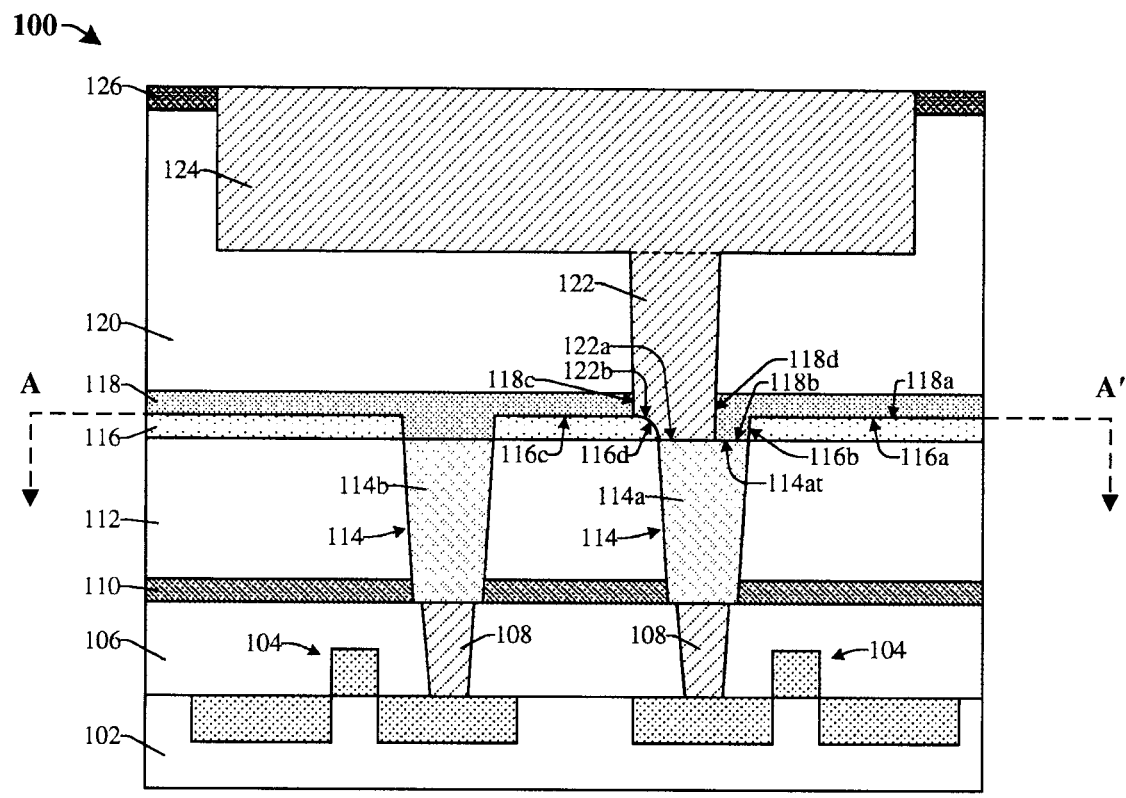
FIG. 1 illustrates a cross-sectional view of some embodiments of an integrated chip comprising a first etch-stop layer and a second etch-stop layer over the first etch-stop layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many integrated chips include an interconnect structure over a substrate. For example, an interconnect structure may include a first metal wire and a second metal wire over a substrate. A first dielectric layer may laterally separate and electrically isolate the first metal wire from the second metal wire. Further, a metal via may be over the first metal wire and may extend through a second dielectric layer and an etch-stop layer to a top of the first metal wire. Furthermore, a third metal wire may be over the metal via. The third metal wire may be electrically connected to the first metal wire through the metal via, and the first metal wire may be electrically connected to one or more semiconductor devices along the substrate.

In some integrated chips, the metal via is formed over the first metal wire by patterning the second dielectric layer and the etch-stop layer to form a via opening in the second dielectric layer and the etch-stop layer, and subsequently depositing a metal in the via opening. In some cases, a misalignment (e.g., an overlay shift) may occur when patterning the second dielectric layer and the etch-stop layer to form the via opening. Because of the misalignment, the patterning may damage or remove some of the underlying first dielectric layer around the first metal wire. As a result, the via opening, and thus the metal via, may extend into the first dielectric layer. The damage caused to the first dielectric layer may reduce a lateral distance between the first and second metal wires. Reducing a lateral distance between the first and second metal wires can negatively impact a reliability of the first dielectric layer. For example, a time dependent dielectric breakdown (TDDB) of the first dielectric layer may be reduced. As a result, a reliability of the integrated chip may be low. Further, reducing the lateral distance between the first and second metal wires may also increase a capacitance between the first metal wire and the second metal wire may be increased and hence a resistance-capacitance (RC) delay of the integrated chip may be increased. As a result, a performance of the integrated chip may be low.

Various embodiments of the present disclosure are related to a method of forming an integrated chip using a dual etch-stop layer that is configured to reduce misalignment damage and improve a reliability and performance of the integrated chip. In some embodiments, the method comprises patterning a first dielectric layer according to a first etch-stop layer to define a first interconnect opening. A metal is formed within the opening to define a first metal wire, while the first etch-stop layer is kept in place to cover a top of the first dielectric layer. A second etch-stop layer is subsequently formed over the first etch-stop layer and between sidewalls of the first etch-stop layer. A second dielectric layer is formed on the second etch-stop layer. The second dielectric layer and the second etch-stop layer are subsequently patterned using an etchant to define a second interconnect opening that exposes the first metal wire. The etchant is configured to etch the second dielectric layer and the second etch-stop layer at a higher rate than the first etch-stop layer. Because of the difference in etch rates, the first etch-stop layer may prevent misalignment of the second interconnect opening from causing damage to the first dielectric layer.

Because the first etch-stop layer may prevent the first dielectric layer from being damaged, a reliability of the first dielectric layer may be maintained. For example, a TDDB of the first dielectric layer may not be reduced. Further, because the first etch-stop layer may prevent the via opening from extending into the first dielectric layer, a distance between the first metal wire and the second metal wire may be maintained. Thus, a capacitance between the first metal wire and a second metal wire may not be increased and hence an RC delay of the integrated chip may be low.

FIG. 1 illustrates a cross-sectional view 100 of some embodiments of an integrated chip comprising a first etch-stop layer 116 and a second etch-stop layer 118 over the first etch-stop layer 116. The cross-sectional view 100 of FIG. 1 may, for example, be taken across line A-A' of FIG. 2.

The integrated chip comprises a plurality of semiconductor devices 104 along a substrate 102. A base dielectric layer 106 is over the substrate 102 and a plurality of contacts 108 extend through the base dielectric layer 106. The plurality of contacts 108 may be electrically connected to any of the plurality of semiconductor devices 104. A base etch-stop layer 110 is over the base dielectric layer 106 and a first interlayer dielectric (ILD) layer 112 is over the base etch-stop layer 110.

A plurality of metal wires 114 are within the first ILD layer 112 and the base etch-stop layer 110. For example, a first metal wire 114a and a second metal wire 114b adjacent to the first metal wire 114a are within the first ILD layer 112. The first ILD layer 112 and the base etch-stop layer 110 laterally separate and electrically isolate the first metal wire 114a from the second metal wire 114b. The first metal wire 114a and the second metal wire 114b extend through the first ILD layer 112 and the base etch-stop layer 110 to underlying contacts of the plurality of contacts 108. The first metal wire 114a and the second metal wire 114b may be electrically connected to any of the plurality of semiconductor devices 104 through the contacts 108.

Further, the first etch-stop layer 116 is over the first ILD layer 112 and the second etch-stop layer 118 is over the first etch-stop layer 116. The second etch-stop layer 118 is also over the first metal wire 114a and the second metal wire 114b. A first lower surface 118a of the second etch-stop layer 118 is on a first top surface 116a of the first etch-stop layer 116, and a second lower surface 118b of the second etch-stop layer 118 is on a top surface 114at of the first metal wire 114a. Further, the second etch-stop layer 118 is on a first sidewall 116b of the first etch-stop layer 116. In some embodiments, a first sidewall 118c of the second etch-stop layer 118 is directly over a second top surface 116c of the first etch-stop layer 116 and a second sidewall 118d of the second etch-stop layer 118 opposite the first sidewall 118c is directly over the top surface 114at of the first metal wire 114a. In some embodiments, the second sidewall 118d of the second etch-stop layer 118 has a greater height than the first sidewall 118c of the second etch-stop layer 118. The first etch-stop layer 116 comprises a first dielectric material and the second etch-stop layer 118 comprises a second dielectric material different from the first dielectric material.

A second ILD layer 120 is over the second etch-stop layer 118, a third etch-stop layer 126 is over the second ILD layer 120, a metal via 122 is within the second ILD layer 120, and an additional metal wire 124 is within the second ILD layer 120. The metal via 122 extends through the second ILD layer 120 and along sidewalls (e.g., 118c, 118d) of the second etch-stop layer 118. The metal via 122 further extends along one or more surfaces (e.g., 116d) the first etch-stop layer 116 to the top surface 114at of the first metal wire 114a. The metal via 122 may be laterally offset (e.g., misaligned) from the first metal wire 114a. For example, the first metal wire 114a may be centered along a first vertical line that is laterally separated from a second vertical line that is centered along the metal via 122. In some embodiments, a first lower surface 122a of the metal via 122 is on the top surface 114at of the first metal wire 114a, and a second lower surface 122b of the metal via 122 is on an upper surface 116d of the first etch-stop layer 116. In some embodiments, the metal via 122 is vertically separated from the first ILD layer 112 by the first etch-stop layer 116.

When forming the metal via 122 over the first metal wire 114a, the second ILD layer 120, the second etch-stop layer 118, and the first etch-stop layer 116 are patterned to form a via opening (not shown). The patterning process may be highly selective to second ILD layer 120 and the second etch-stop layer 118 relative to the first etch-stop layer 116 (e.g., the second ILD layer 120 and the second etch-stop layer 118 may be removed at substantially faster rates than the first etch-stop layer 116). Thus, even in the case of misalignment, the first etch-stop layer 116 may prevent the patterning process from damaging the underlying first ILD layer 112. For example, if misalignment occurs in the patterning process, the patterning may modify a portion of the first etch-stop layer 116, as reflected in curved shape of the upper surface 116d of the first etch-stop layer. However, the patterning may not extend through the first etch-stop layer 116 to the underlying first ILD layer 112 because of the selectivity of the patterning.

Thus, because the first etch-stop layer 116 may prevent the first ILD layer 112 from being damaged, a reliability of the first ILD layer 112 may be maintained. For example, a TDDB of the first ILD layer 112 may not be reduced.

Further, because the first etch-stop layer 116 may prevent the via opening, and hence the metal via 122, from extending into the first ILD layer 112, a distance between the first metal wire 114a and the second metal wire 114b may be maintained. Thus, a capacitance between the first metal wire 114a and a second metal wire 114b may not be increased and hence an RC delay of the integrated chip may be low.

Figure 2:
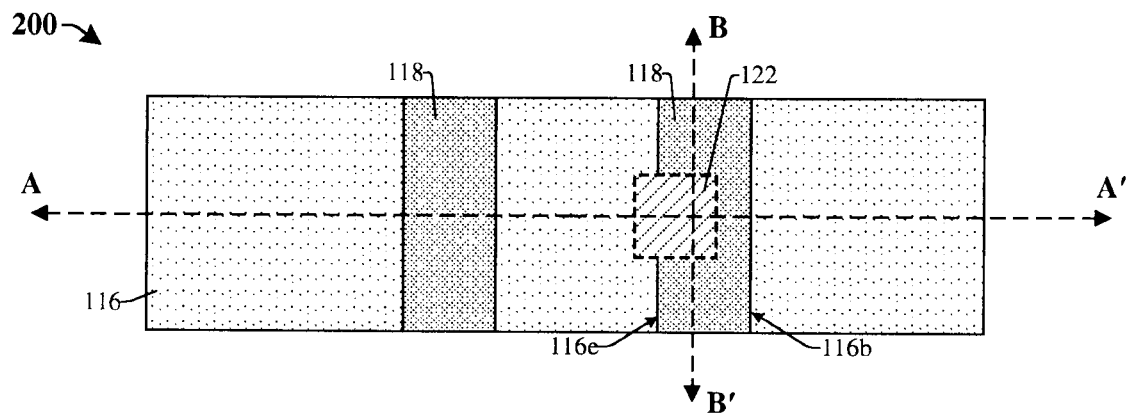
FIG. 2 illustrates a top view of some embodiments of an integrated chip comprising a first etch-stop layer and a second etch-stop layer over the first etch-stop layer.

FIG. 2 illustrates a top view 200 of some embodiments of an integrated chip comprising a first etch-stop layer 116 and a second etch-stop layer 118 over the first etch-stop layer 116.

In such embodiments, the second etch-stop layer 118 extends over the first metal wire 114a, over the second metal wire 114b, and between sidewalls of the first etch-stop layer 116. For example, the second etch-stop layer 118 extends from on a first sidewall 116b of the first etch-stop layer 116 to on a second sidewall 116e of the first etch-stop layer 116 opposite the first sidewall 116b. Further, the second etch-stop layer 118 has a length that extends along a length of the underlying first and second metal wires 114a, 114b. In some embodiments, the length of the second etch-stop layer 118 may be approximately equal to the length of the first and second metal wires 114a, 114b. In some embodiments, a length of the metal via 122 is less than the length of the second etch-stop layer 118. In some embodiments, the length of the metal via 122 may be approximately equal to a width of the metal via 122.

Figure 3:
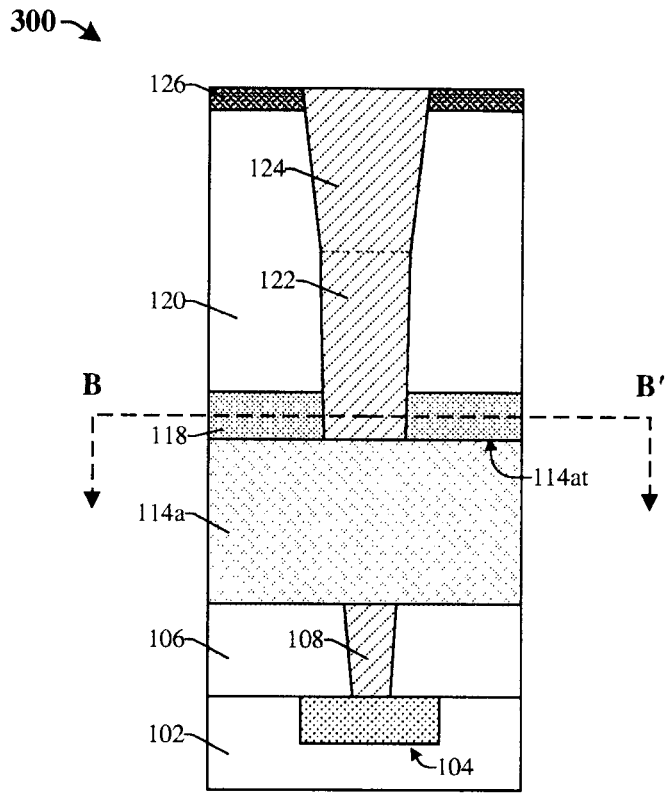
FIG. 3 illustrates another cross-sectional view of some embodiments of an integrated chip comprising a first etch-stop layer and a second etch-stop layer over the first etch-stop layer.

FIG. 3 illustrates another cross-sectional view 300 of some embodiments of an integrated chip comprising a first etch-stop layer 116 and a second etch-stop layer 118 over the first etch-stop layer 116. The cross-sectional view 300 of FIG. 3 may, for example, be taken across line B-B' of FIG. 2.

In such embodiments, the second etch-stop layer 118 is on a top surface 114at of the first metal wire 114a and extends along the top surface 114at of the first metal wire 114a on opposite sides of the metal via 122. The metal via 122 extends through the second etch-stop layer 118 to the top surface 114at of the first metal wire 114a.

Although FIGS. 1, 2, and 3 illustrate the first etch-stop layer 116 and the second etch-stop layer 118 on a first level of interconnect (e.g., on a first metal level that is immediately over a contact level), it will be appreciated that the first etch-stop layer 116 and the second etch-stop layer 118 may be implemented on any other level of interconnect. For example, the first etch-stop layer 116 and the second etch-stop layer 118 may be implemented on a second metal level, a third metal level, a fourth metal level, or some other suitable level of interconnect.

Figure 4:
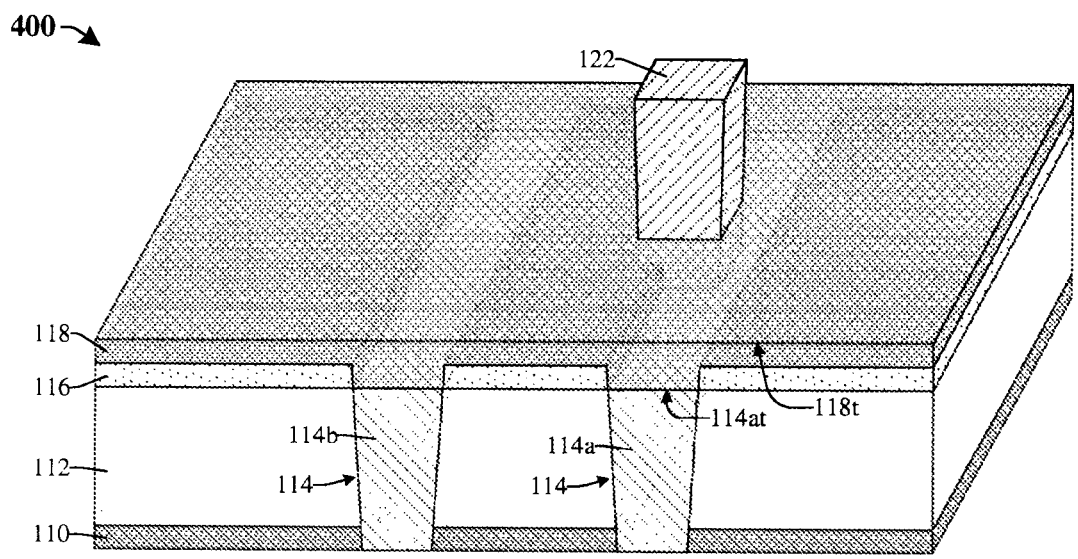
FIG. 4 illustrates a three-dimensional view of some embodiments of an integrated chip comprising a first etch-stop layer and a second etch-stop layer over the first etch-stop layer.

FIG. 4 illustrates a three-dimensional view 400 of some embodiments of an integrated chip comprising a first etch-stop layer 116 and a second etch-stop layer 118 over the first etch-stop layer 116.

In such embodiments, the second etch-stop layer 118 surrounds the metal via 122 in a closed loop (e.g., along a top surface of the second etch-stop layer 118). Further, the second etch-stop layer 118 is on, and extends along, a first pair of opposing sidewalls of the metal via 122 and a second pair of opposing sidewalls of the metal via 122. In some embodiments, the second etch-stop layer 118 extends vertically along a sidewall of the metal via 122 from a top surface 118t of the second etch-stop layer 118 to a top surface 114at of an underlying first metal wire 114a.

It should be noted that only the base etch-stop layer 110, the first ILD layer 112, the plurality of metal wires 114, the first etch-stop layer 116, the second etch-stop layer 118, and the metal via 122 are shown in FIG. 4 for simplicity of illustration.

Figure 5:
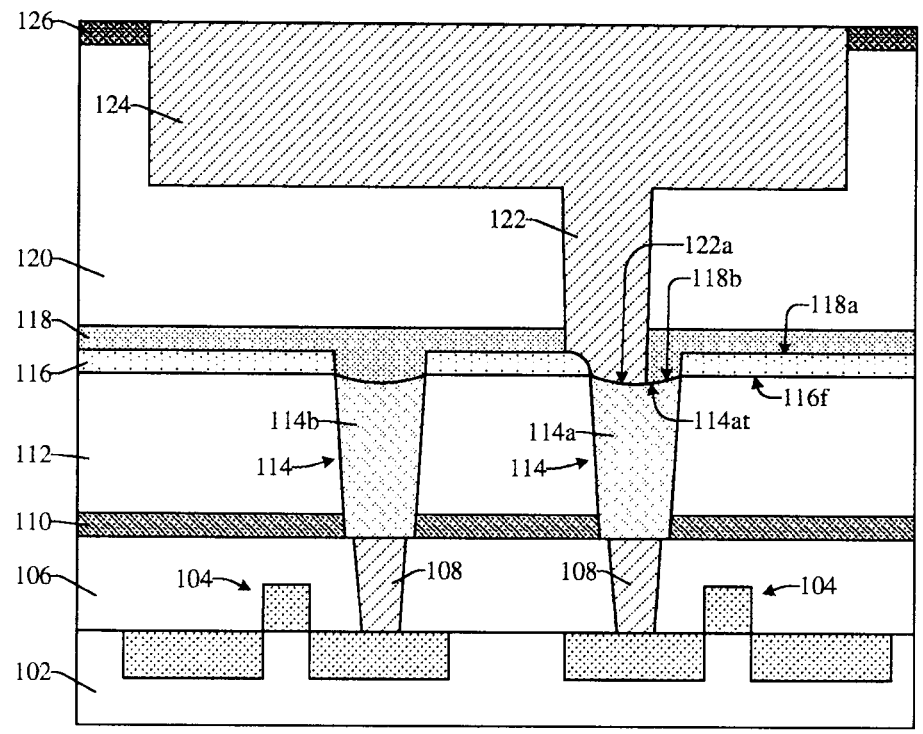
FIG. 5 illustrates a cross-sectional view of some embodiments of an integrated chip comprising a first etch-stop layer and a second etch-stop layer in which the second etch-stop layer has a curved lower surface.

FIG. 5 illustrates a cross-sectional view 500 of some embodiments of an integrated chip comprising a first etch-stop layer 116 and a second etch-stop layer 118 in which the second etch-stop layer 118 has a curved lower surface 118b.

In such embodiments, a top surface 114at of a first metal wire 114a is curved (e.g., concave). The second etch-stop layer 118a has a first lower surface 118a and a second lower surface 118b. The second lower surface 118b of the second etch-stop layer 118 is on the curved top surface 114at of the first metal wire 114a and hence the second lower surface 118b of the second etch-stop layer 118 is also curved (e.g., convex). Further, a first lower surface 122a of a metal via 122 is on the curved top surface 114at of the first metal wire 114a and hence the first lower surface 122a is also curved (e.g., convex). In some embodiments, because the top surface 114at of the first metal wire 114a is curved, the second lower surface 118b of the second etch-stop layer 118 is below a bottom surface 116f of the first etch-stop layer 116.

The first metal wire 114a may have a curved top surface 114at as a result of the first metal wire 114a being recessed (see, for example, FIGS. 16 and 17) after forming the first metal wire 114a. For example, the recessing may remove portions of the first metal wire 114a along a center of the first metal wire 114a faster than along sides of the first metal wire 114a, resulting in the top surface 114at of the first metal wire 114a being curved after the recessing.

Figure 6:
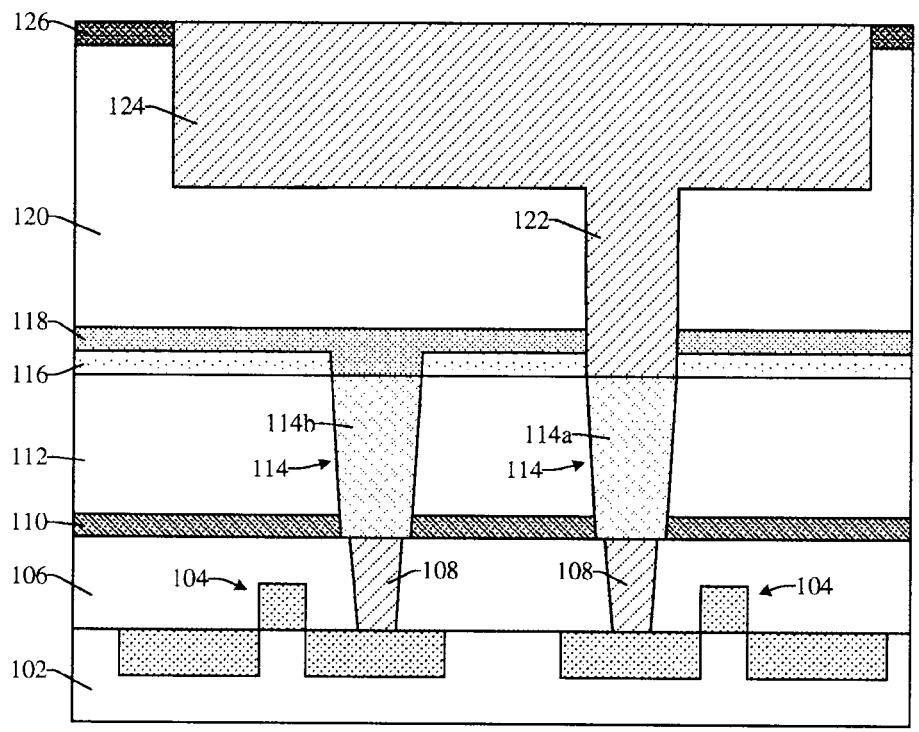
FIG. 6 illustrates a cross-sectional view of some embodiments of an integrated chip comprising a first etch-stop layer and a second etch-stop layer in which a metal via is aligned with a first metal wire.

FIG. 6 illustrates a cross-sectional view 600 of some embodiments of an integrated chip comprising a first etch-stop layer 116 and a second etch-stop layer 118 in which a metal via 122 is aligned with a first metal wire 114a.

In such embodiments, sidewalls of the metal via 122 are aligned with sidewalls of the underlying first metal wire 114a. In some embodiments, the sidewalls of the metal via 122 and the sidewalls of the first metal wire 114a may be approximately coplanar. Further, in some embodiments, the sidewalls of the metal via 122 are on sidewalls of the first etch-stop layer 116. In some embodiments, the sidewalls of the metal via 122 may be in direct contact with the sidewalls of the first etch-stop layer 116.

In some embodiments, the sidewalls of the metal via 122 may be aligned with the sidewalls of the first metal wire 114a due to little or no misalignment in the metal via 122 formation process.

Figure 7:
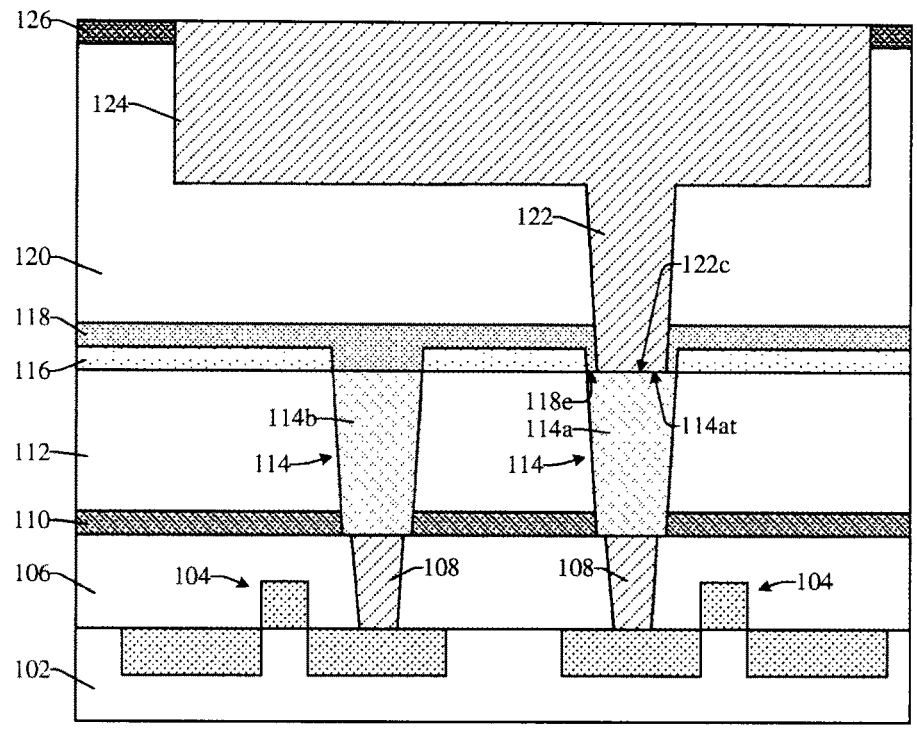
FIG. 7 illustrates a cross-sectional view of some alternative embodiments of an integrated chip comprising a first etch-stop layer and a second etch-stop layer in which a metal via is aligned with a first metal wire.

FIG. 7 illustrates a cross-sectional view 700 of some alternative embodiments of an integrated chip comprising a first etch-stop layer 116 and a second etch-stop layer 118 in which a metal via 122 is aligned with a first metal wire 114a.

In such embodiments, the metal via 122 is aligned with the first metal wire 114a such that the metal via 122 is not laterally offset from the first metal wire 114a. Further, a bottom surface 122c of the metal via 122 is on a top surface 114at of the first metal wire 114a and the bottom surface 122c of the metal via 122 is narrower than the top surface 114at of the first metal wire 114a. Furthermore, a bottom surface 118e of the second etch-stop layer 118 may be on the top surface 114at of the first metal wire 114a and on opposite sides of the metal via 122. Further, the bottom surface 118e of the second etch-stop layer 118 may surround the metal via 122 along the top surface 114at of the first metal wire 114a. In other words, the second etch-stop layer 118 may surround the metal via 122 between sidewalls of the first etch-stop layer 116.

In such embodiments, the metal via 122 may be aligned with the first metal wire 114a due to little or no misalignment in the metal via 122 formation process. Further, the bottom surface 122c of the metal via 122 may be narrower than the top surface 114at of the first metal wire 114a due to the profile of the metal via 122 (e.g., the angles of the sidewalls of the metal via 122). For example, the metal via 122 may be wider along a top of the metal via 122 than along a bottom of the metal via 122 such that the metal via 122 narrows along its depth. As a result, at the depth where the metal via 122 meets the first metal wire 114a, the width of the bottom surface 122c of the metal via 122 may be less than the width of the top surface 114at of the first metal wire 114a.

Figure 8:
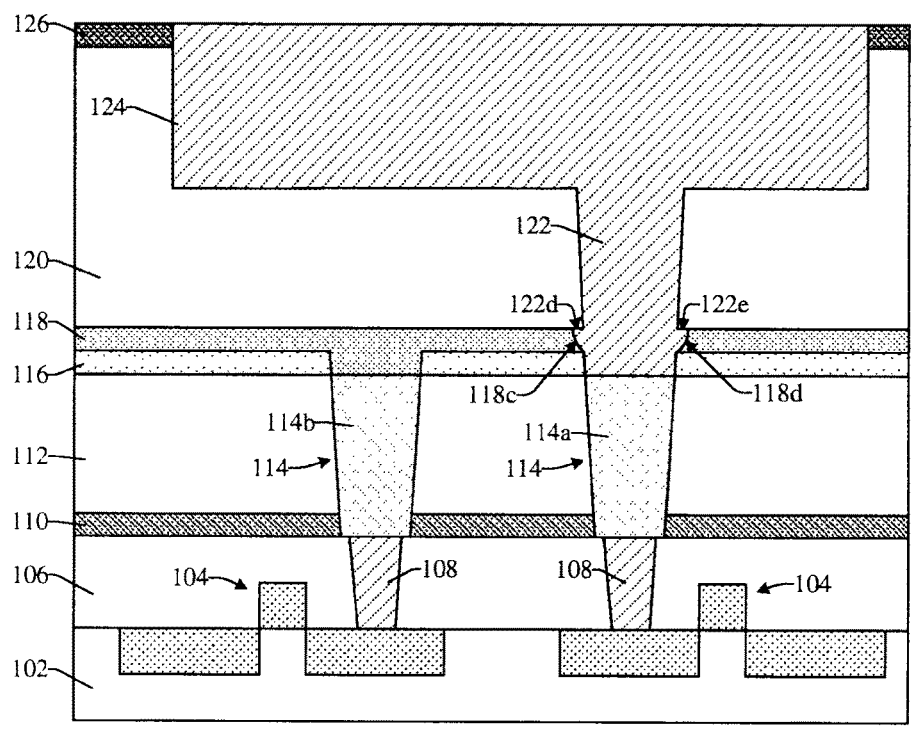
FIG. 8 illustrates a cross-sectional view of some embodiments of an integrated chip comprising a first etch-stop layer and a second etch-stop layer in which the second etch-stop layer has curved sidewalls.

FIG. 8 illustrates a cross-sectional view 800 of some embodiments of an integrated chip comprising a first etch-stop layer 116 and a second etch-stop layer 118 in which the second etch-stop layer 118 has curved sidewalls.

In such embodiments, the second etch-stop layer 118 has curved (e.g., concave) sidewalls along a metal via 122. For example, in some embodiments, a first sidewall 118c of the second etch-stop layer 118 and a second sidewall 118d of the second etch-stop layer 118 are curved. Further, the metal via 122 also has curved sidewalls (e.g., convex) along the curved sidewalls (e.g., 118c, 118d) of the second etch-stop layer 118. In some embodiments, the metal via 122 is aligned with an underlying first metal wire 114a. In some embodiments, the curved sidewalls (e.g. 118c, 118d) of the second etch-stop layer 118 are over the first etch-stop layer 116. In some embodiments, the metal via 122 has one or more upper surfaces (e.g., 122d, 122e) that are on one or more lower surfaces of the second ILD layer 120. The curved sidewalls of the metal via 122 define a protrusion that extends outward from a sidewall of the metal via 122 to laterally past a sidewall of the second ILD layer 120. In some embodiments, the protrusion is confined between an upper surface of the first etch-stop layer 116 and a lower surface of the second ILD layer 120.

The second etch-stop layer 118 may have curved sidewalls because an etch used to form an opening in the second etch-stop layer 118 may have an isotropic characteristic (e.g., a lateral component). For example, a wet etching process may be used to form an opening in the second etch-stop layer 118, and the wet etching process may etch the second etch-stop layer 118 in both vertical and lateral directions.

Figure 9:
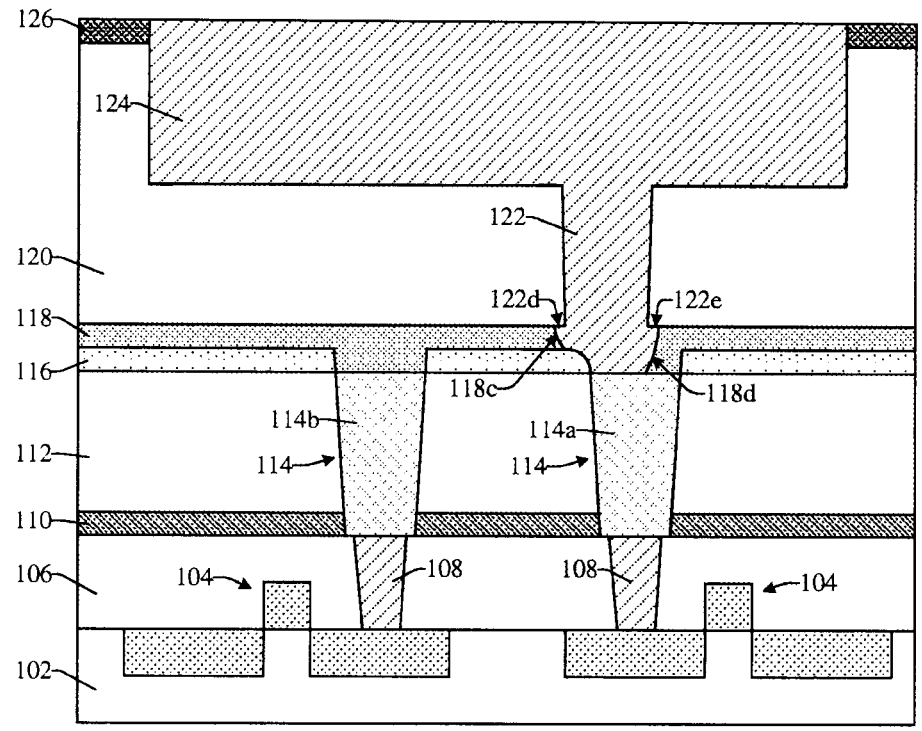
FIG. 9 illustrates a cross-sectional view of some alternative embodiments of an integrated chip comprising a first etch-stop layer and a second etch-stop layer in which the second etch-stop layer has curved sidewalls.

FIG. 9 illustrates a cross-sectional view 900 of some alternative embodiments of an integrated chip comprising a first etch-stop layer 116 and a second etch-stop layer 118 in which the second etch-stop layer 118 has curved sidewalls.

In such embodiments, the second etch-stop layer 118 has curved (e.g., concave) sidewalls along a metal via 122. The metal via 122 also has curved sidewalls (e.g., convex) along the curved sidewalls of the second etch-stop layer 118. Further, in such embodiments, the metal via 122 is misaligned (e.g., offset) with an underlying first metal wire 114a. In some embodiments, a first curved sidewall 118c of the second etch-stop layer 118 is over the first etch-stop layer 116, and a second curved sidewall 118d of the second etch-stop layer 118 opposite the first curved sidewall 118c is over the first metal wire 114a. In some embodiments, the second curved sidewall 118d may have a greater height than the first curved sidewall 118c. In some embodiments, the metal via 122 has one or more upper surfaces (e.g., 122d, 122e) that are on one or more lower surfaces of the second ILD layer 120.

Again, the second etch-stop layer 118 may have curved sidewalls because an etch used to form an opening in the second etch-stop layer 118 may have an isotropic charac-teristic (e.g., a lateral component). For example, a wet etching process may be used to form an opening in the second etch-stop layer 118, and the wet etching process may etch the second etch-stop layer 118 is both vertical and lateral directions.

Figure 10:
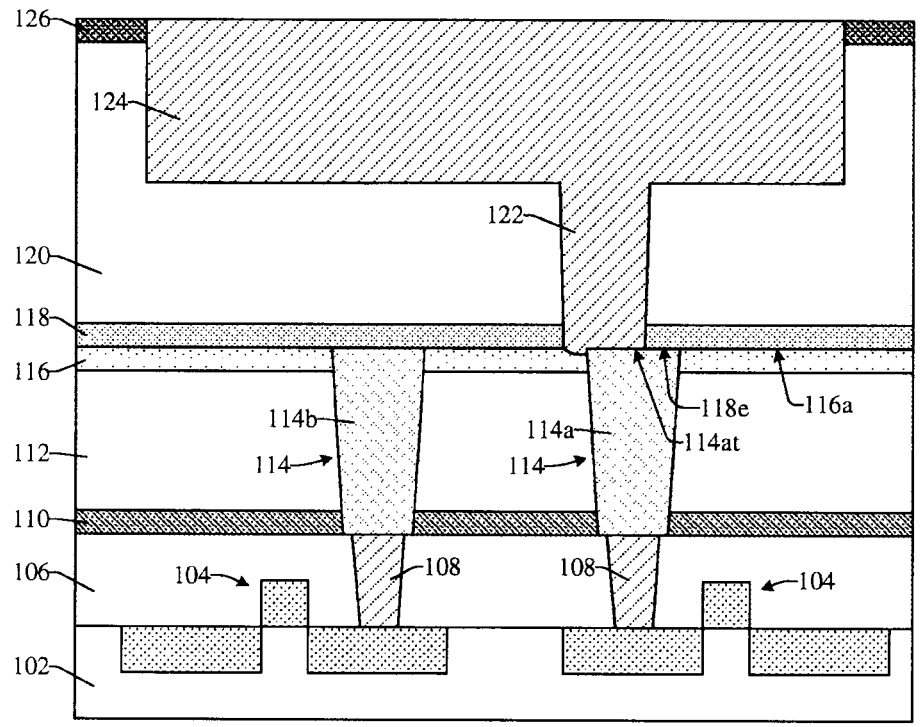
FIG. 10 illustrates a cross-sectional view of some embodiments of an integrated chip comprising a first etch-stop layer and a second etch-stop layer in which the first etch-stop layer extends along opposing sidewalls of a first metal wire.

FIG. 10 illustrates a cross-sectional view 1000 of some embodiments of an integrated chip comprising a first etch-stop layer 116 and a second etch-stop layer 118 in which the first etch-stop layer 116 extends along opposing sidewalls of a first metal wire 114a.

In such embodiments, a top surface 114at of the first metal wire 114a and a top surface 116a of the first etch-stop layer 116 are approximately coplanar (e.g., coplanar within a tolerance of a chemical mechanical polishing (CMP) process). In some embodiments, the opposing sidewalls of the first metal wire 114a may be in direct contact with sidewalls of the first etch-stop layer 116. In some embodiments, a bottom surface 118e of the second etch-stop layer 118 extends from over the first etch-stop layer 116 to over the first metal wire 114a. In some embodiments, the first metal wire 114a is on a first sidewall of the first etch-stop layer 116 and on a second sidewall of the first etch-stop layer 116 opposite the first sidewall.

Figure 16:
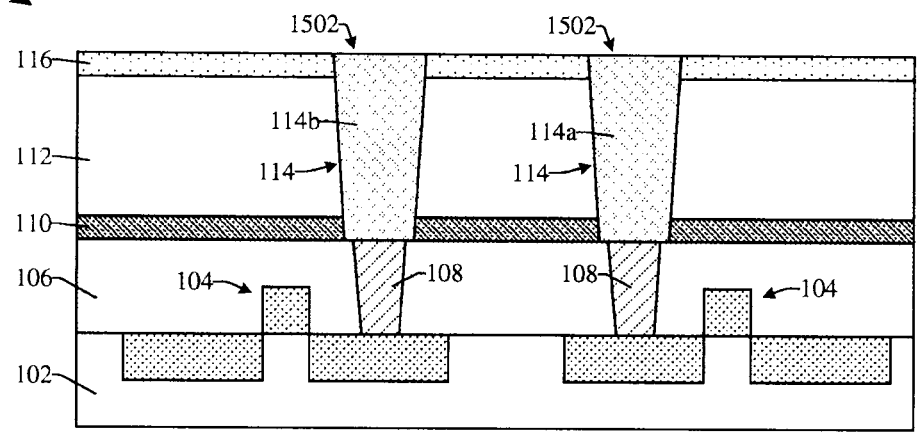

The first etch-stop layer 116 may extend along the opposing sidewalls of the first metal wire 114a because the first metal wire 114a may not be recessed after the first metal wire 114a is formed (see, for example, FIG. 16).

In some embodiments, a metal via 122 may be on a top surface of the first metal wire 114a and may be misaligned with the first metal wire 114a. Further, an upper surface of the first etch-stop layer 116 may be curved as a result of the via misalignment. For example, when patterning the second etch-stop layer 118 to form a via opening in the second etch-stop layer 118, the patterning process may affect the first etch-stop layer 116, thereby forming the curved upper surface of the first etch-stop layer 116.

In some embodiments, the substrate 102 may, for example, comprise silicon, some III-V material, some other semiconductor material, or the like.

In some embodiments, the plurality of semiconductor devices 104 may, for example, be or comprise any of metal-oxide-semiconductor field-effect transistors (MOS-FETs), bipolar junction transistors (BJTs), junction field-effect transistors (JFETs), fin field-effect transistors (Fin-FETs), gate-all-around field-effect transistors (GAA FETs), some other suitable semiconductor device(s), or the like.

In some embodiments, the base dielectric layer 106 may, for example, comprise any of silicon carbide (e.g., SiC), silicon dioxide (e.g., SiO2), silicon oxycarbide (e.g., SiOC), silicon carbon hydrogen (e.g., SiCH), silicon nitride (e.g., SiN), silicon carbonitride (e.g., SiCN), silicon oxynitride (e.g., SiON), silicon oxycarbonitride (e.g., SiOCN), aluminum oxide (e.g., AlO), aluminum oxynitride (e.g., AlON), aluminum nitride (e.g., AlN), or some other suitable dielectric.

In some embodiments, the plurality of contacts 108 may, for example, comprise any of tantalum (e.g., Ta), tantalum nitride (e.g., TaN), titanium nitride (e.g., TiN), copper (e.g., Cu), cobalt (e.g., Co), Ruthenium (e.g., Ru), molybdenum (e.g., Mo), iridium (e.g., Ir), tungsten (e.g., W), or some other suitable conductive material.

In some embodiments, the base etch-stop layer 110 may, for example, comprise any of silicon carbide (e.g., SiC), silicon dioxide (e.g., SiO2), silicon oxycarbide (e.g., SiOC), silicon nitride (e.g., SiN), silicon carbonitride (e.g., SiCN), silicon oxynitride (e.g., SiON), silicon oxycarbonitride (e.g., SiOCN), aluminum oxynitride (e.g., AlON), aluminum oxide (e.g., AlO), or some other suitable dielectric.

In some embodiments, the first ILD layer 112, the second ILD layer 120, and the third etch-stop layer 126 may, for example, comprise any of silicon carbide (e.g., SiC), silicon dioxide (e.g., SiO2), silicon oxycarbide (e.g., SiOC), silicon carbon hydrogen (e.g., SiCH), silicon nitride (e.g., SiN), silicon carbonitride (e.g., SiCN), silicon oxynitride (e.g., SiON), silicon oxycarbonitride (e.g., SiOCN), aluminum oxide (e.g., AlO), aluminum oxynitride (e.g., AlON), aluminum nitride (e.g., AlN), or some other suitable dielectric.

The first etch-stop layer 116 comprises a first dielectric material and the second etch-stop layer 118 comprises a second dielectric material different from the first dielectric material. In some embodiments, the first etch-stop layer 116 and/or the second etch-stop layer 118 may, for example, comprise any of silicon carbide (e.g., SiC), silicon dioxide (e.g., SiO2), silicon oxycarbide (e.g., SiOC), silicon carbon hydrogen (e.g., SiCH), silicon nitride (e.g., SiN), silicon carbonitride (e.g., SiCN), silicon oxynitride (e.g., SiON), silicon oxycarbonitride (e.g., SiOCN), aluminum oxide (e.g., AlO), aluminum oxynitride (e.g., AlON), aluminum nitride (e.g., AlN), or some other suitable dielectric.

In some embodiments, the plurality of metal wires 114, the metal via 122, and the additional metal wire 124 may, for example, comprise any of tantalum (e.g., Ta), tantalum nitride (e.g., TaN), titanium nitride (e.g., TiN), copper (e.g., Cu), cobalt (e.g., Co), Ruthenium (e.g., Ru), molybdenum (e.g., Mo), iridium (e.g., Jr), tungsten (e.g., W), or some other suitable conductive material.

FIGS. 11-26 illustrate cross-sectional views 1100-2600 of some embodiments of a method for forming an integrated chip comprising a first etch-stop layer and a second etch-stop layer over the first etch-stop layer. Although FIGS. 11-26 are described in relation to a method, it will be appreciated that the structures disclosed in FIGS. 11-26 are not limited to such a method, but instead may stand alone as structures independent of the method.

Figure 11:
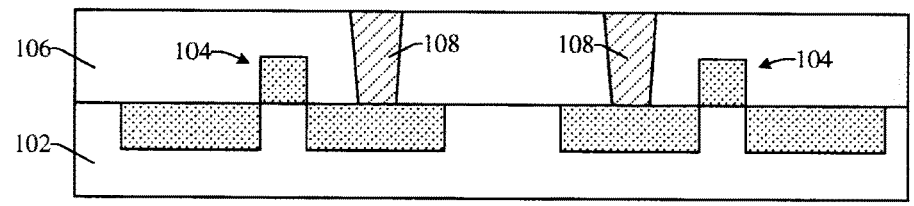
FIGS. 11-26 illustrate cross-sectional views of some embodiments of a method for forming an integrated chip comprising a first etch-stop layer and a second etch-stop layer over the first etch-stop layer.

As shown in cross-sectional view 1100 of FIG. 11, a plurality of semiconductor devices 104 are formed along a substrate 102, a base dielectric layer 106 is formed over the substrate 102, and a plurality of contacts 108 are formed within the base dielectric layer 106.

The plurality of semiconductor devices 104 may, for example, be formed by any of an ion implantation process, a deposition process, a patterning process, or some other suitable process(es).

The base dielectric layer 106 may, for example, be formed by depositing any of silicon carbide (e.g., SiC), silicon dioxide (e.g., SiO2), silicon oxycarbide (e.g., SiOC), silicon carbon hydrogen (e.g., SiCH), silicon nitride (e.g., SiN), silicon carbonitride (e.g., SiCN), silicon oxynitride (e.g., SiON), silicon oxycarbonitride (e.g., SiOCN), aluminum oxide (e.g., AlO), aluminum oxynitride (e.g., AlON), aluminum nitride (e.g., AlN), or some other suitable dielectric over the substrate 102 by any of a chemical vapor deposition (CVD) process, a physical vapor deposition (PVD) process, an atomic layer deposition (ALD) process, a spin on process, or some other suitable process.

The plurality of contacts 108 may, for example, be formed by patterning the base dielectric layer 106, depositing one or more metals over the patterned base dielectric layer 106, and planarizing the one or more metals. The patterning may, for example, comprise a dry etching process. The one or more metals may, for example, comprise any of tantalum (e.g., Ta), tantalum nitride (e.g., TaN), titanium nitride (e.g., TiN), copper (e.g., Cu), cobalt (e.g., Co), Ruthenium (e.g., Ru), molybdenum (e.g., Mo), iridium (e.g., Ir), tungsten (e.g., W), or some other suitable conductive material, and may be deposited by any of a CVD process, a PVD process, an ALD process, a electrochemical plating (ECP) process, a sputtering process, a spin on process, or some other suitable process. The planarization process may, for example, be or comprise a chemical mechanical planarization (CMP) or some other suitable planarization process.

Figure 12:
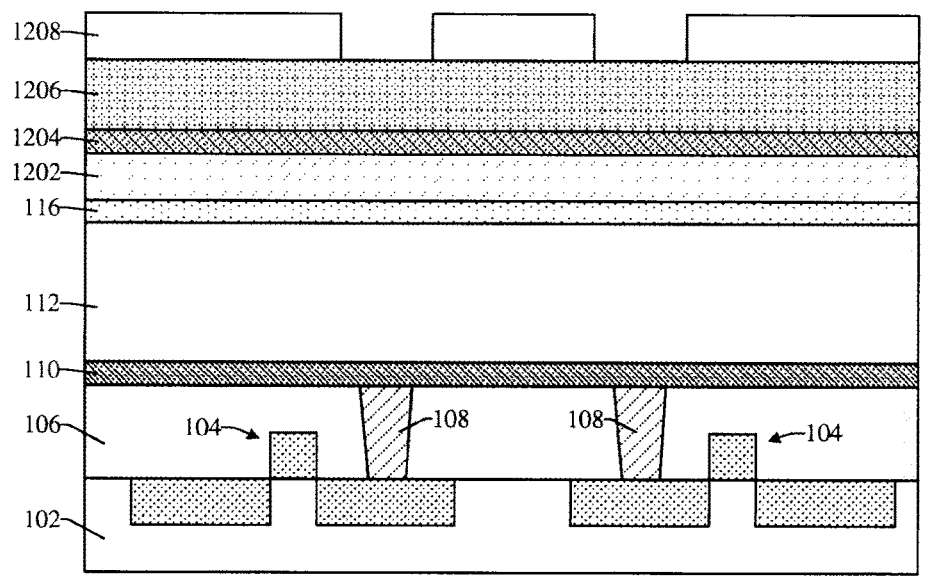

As shown in cross-sectional view 1200 of FIG. 12, a base etch-stop layer 110 is formed over the substrate 102, a first interlayer dielectric (ILD) layer 112 is formed over the base etch-stop layer 110, a first etch-stop layer 116 is formed over the first ILD layer 112, a first hard mask 1202 is formed over the first etch-stop layer 116, a second hard mask 1204 is formed over the first hard mask 1202, a first anti-reflective coating (ARC) layer 1206 is formed over the second hard mask 1204, and a first photoresist mask 1208 is formed over the first ARC layer 1206.

The base etch-stop layer 110 may, for example, be formed by depositing any of silicon carbide (e.g., SiC), silicon dioxide (e.g., SiO2), silicon oxycarbide (e.g., SiOC), silicon nitride (e.g., SiN), silicon carbonitride (e.g., SiCN), silicon oxynitride (e.g., SiON), silicon oxycarbonitride (e.g., SiOCN), aluminum oxynitride (e.g., AlON), aluminum oxide (e.g., AlO), or some other suitable dielectric over the substrate 102 by any of a CVD process, a PVD process, an ALD process, a spin on process, or some other suitable process. A temperature during the deposition may, for example, be about 20 to 400 degrees Celsius or some other suitable value. Further, a thickness of the base etch-stop layer 110 may, for example, be about 10 to 1000 angstroms or some other suitable value.

The first ILD layer 112 may, for example, be formed by depositing any of silicon carbide (e.g., SiC), silicon dioxide (e.g., SiO2), silicon oxycarbide (e.g., SiOC), silicon carbon hydrogen (e.g., SiCH), silicon nitride (e.g., SiN), silicon carbonitride (e.g., SiCN), silicon oxynitride (e.g., SiON), silicon oxycarbonitride (e.g., SiOCN), aluminum oxide (e.g., AlO), aluminum oxynitride (e.g., AlON), aluminum nitride (e.g., AlN), or some other suitable dielectric over the substrate 102 by any of a CVD process, a PVD process, an ALD process, a spin on process, or some other suitable process. A temperature during the deposition may, for example, be about 25 to 400 degrees Celsius or some other suitable value. Further, a thickness of the first ILD layer 112 may, for example, be about 10 to 800 angstroms or some other suitable value.

The first etch-stop layer 116 may, for example, be formed by depositing any of silicon carbide (e.g., SiC), silicon dioxide (e.g., SiO2), silicon oxycarbide (e.g., SiOC), silicon carbon hydrogen (e.g., SiCH), silicon nitride (e.g., SiN), silicon carbonitride (e.g., SiCN), silicon oxynitride (e.g., SiON), silicon oxycarbonitride (e.g., SiOCN), aluminum oxide (e.g., AlO), aluminum oxynitride (e.g., AlON), aluminum nitride (e.g., AlN), or some other suitable dielectric over the substrate 102 by any of a CVD process, a PVD process, an ALD process, a spin on process, or some other suitable process. A temperature during the deposition may, for example, be about 25 to 400 degrees Celsius or some other suitable value. Further, a thickness of the first etch-stop layer 116 may, for example, be about 10 to 800 angstroms or some other suitable value.

The first hard mask 1202 and the second hard mask 1204 may, for example, be formed by depositing any of titanium nitride (e.g., TiN), titanium oxide (e.g., TiO), tungsten (e.g., W), tungsten doped carbon (e.g., WdC), hafnium oxide (e.g., HfO), zirconium oxide (e.g., ZrO), zinc oxide (e.g., ZnO), titanium zirconium oxide (e.g., TiZrO), silicon carbide (e.g., SiC), silicon dioxide (e.g., SiO2), silicon oxycarbide (e.g., SiOC), silicon nitride (e.g., SiN), silicon carbonitride (e.g., SiCN), silicon oxynitride (e.g., SiON), silicon oxycarbonitride (e.g., SiOCN), aluminum oxide (e.g., AlO), aluminum oxynitride (e.g., AlON), or some other suitable material over the substrate 102 by any of a CVD process, a PVD process, an ALD process, a spin on process, or some other suitable process. A temperature during the deposition may, for example, be about 50 to 400 degrees Celsius or some other suitable value. Further, a thickness of the first hard mask 1202 and/or a thickness of the second hard mask 1204 may, for example, be about 30 to 500 angstroms or some other suitable value.

The first ARC layer 1206 may, for example, be formed by depositing some organic polymer, some inorganic polymer, or some other suitable material over the substrate 102 by a CVD process, a PVD process, an ALD process, a spin on process, or some other suitable process.

The first photoresist mask 1208 may, for example, be formed by depositing photoresist over the substrate 102 by a CVD process, a PVD process, an ALD process, a spin on process, or some other suitable process, and subsequently developing the photoresist.

Figure 13:
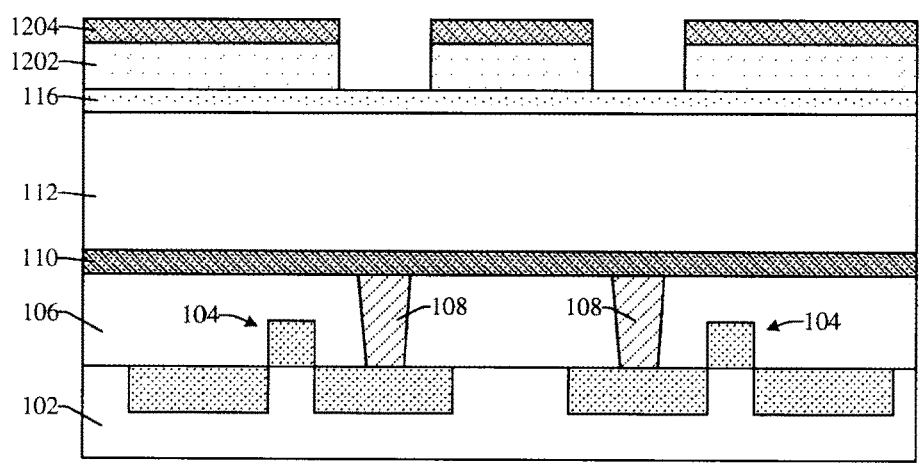

As shown in cross-sectional view 1300 of FIG. 13, the second hard mask 1204 and the first hard mask 1202 are patterned according to the first photoresist mask (e.g., 1208 of FIG. 12).

The patterning may, for example, comprise a dry etching process or some other suitable etching process. For example, the patterning may comprise an inductively coupled plasma (ICP) reactive ion etching (RIE) process, a conductively coupled plasma (CCP) RIE process, or some other suitable process.

Figure 14:
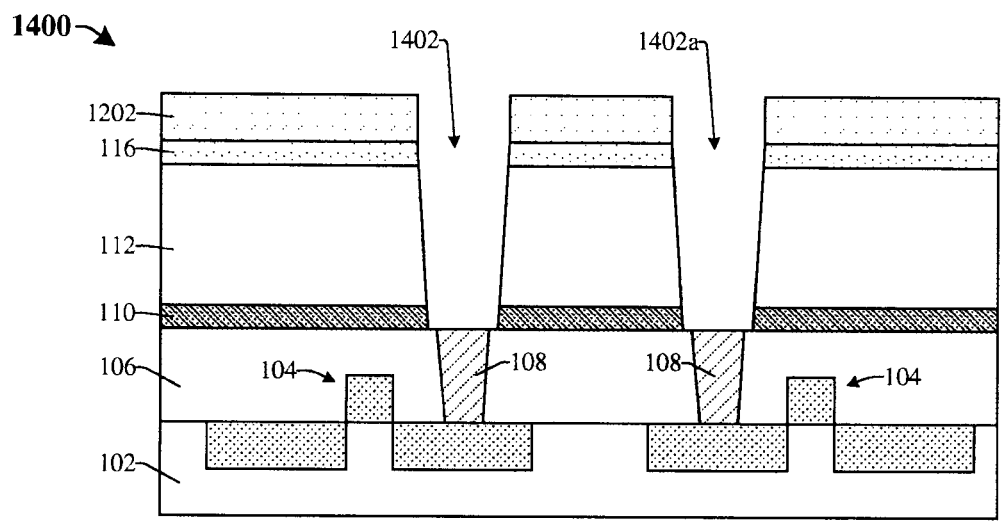

As shown in cross-sectional view 1400 of FIG. 14, the first etch-stop layer 116, the first ILD layer 112, and the base etch-stop layer 110 are patterned according to the first hard mask 1202 to form a plurality of lower wire openings 1402 in the first etch-stop layer 116, the first ILD layer 112, and the base etch-stop layer 110. The plurality of lower wire openings 1402 are defined by sidewalls of the first etch-stop layer 116, sidewalls of the first ILD layer 112, and sidewalls of the base etch-stop layer 110. For example, the patterning forms a first lower wire opening 1402a in the first etch-stop layer 116, the first ILD layer 112, and the base etch-stop layer 110. The first lower wire opening is defined by a pair of sidewalls of the first etch-stop layer 116, a pair of sidewalls of the first ILD layer 112, and a pair of sidewalls of the base etch-stop layer 110.

In some embodiments, the first etch-stop layer 116, the first ILD layer 112, and the base etch-stop layer 110 are patterned are each patterned with a common patterning process. In some other embodiments, the first etch-stop layer 116 and the first ILD layer 112 are patterned with a first patterning process, and the base etch-stop layer 110 is patterned with a second patterning process.

The patterning of the first etch-stop layer 116 and the first ILD layer 112 (e.g., the first patterning process) may comprise a dry etching process or some other suitable etching process. For example, the patterning may comprise an ICP RIE process, a CCP RIE process, or some other suitable process. The patterning may, for example, utilize any of methane (e.g., CH4), fluoromethane (e.g., CH3F), difluoromethane (e.g., CH2F2), trifluoromethane (e.g., CHF3), octafluorocyclobutane (e.g., C4F8), hexafluoro-1,3-butadiene (e.g., C4F6), tetrafluoromethane (e.g., CF4), hydrogen (e.g., H2), hydrogen bromide (e.g., HBr), carbon monoxide (e.g., CO), carbon dioxide (e.g., CO2), oxygen (e.g., O2), boron trichloride (e.g., BCl3), chlorine (e.g., Cl2), nitrogen (e.g., N2), helium (e.g., He), neon (e.g., Ne), argon (e.g., Ar), or some other suitable gas. A pressure applied during the patterning may, for example, be about 0.2 to 120 millitorr or some other suitable value. A temperature applied during the pattering may, for example, be about 0 to 100 degrees Celsius or some other suitable value. A power applied during the patterning may, for example, be about 50 to 3000 watts. A bias voltage applied during the patterning may, for example, be about 0 to 1200 volts or some other suitable value.

In some embodiments, the second hard mask 1204 may be removed during and/or after the first patterning process. For example, the second hard mask 1204 may be consumed by the dry etching process.

Further, the patterning of the base etch-stop layer 110 (e.g., the second patterning process) may comprise a wet etching process, a dry etching process, or some other suitable etching process. The wet etching process may, for example, utilize any of hydrofluoric acid, phosphoric acid, potassium hydroxide, tetramethylammonium hydroxide, nitric acid, or some other suitable wet etchant. Further, the dry etching process may, for example, comprise an ICP RIE process, a CCP RIE process, a remote plasma etching process, or some other suitable process. The dry etching process may, for example, utilize any of methane (e.g., CH4), fluoromethane (e.g., CH3F), difluoromethane (e.g., CH2F2), trifluoromethane (e.g., CHF3), octafluorocyclobutane (e.g., C4F8), hexafluoro-1,3-butadiene (e.g., C4F6), tetrafluoromethane (e.g., CF4), hydrogen (e.g., H2), hydrogen bromide (e.g., HBr), carbon monoxide (e.g., CO), carbon dioxide (e.g., CO2), oxygen (e.g., O2), boron trichloride (e.g., BCl3), chlorine (e.g., Cl2), nitrogen (e.g., N2), helium (e.g., He), neon (e.g., Ne), argon (e.g., Ar), or some other suitable gas. A pressure applied during the dry etching process may, for example, be about 0.2 to 120 millitorr or some other suitable value. A temperature applied during the dry etching process may, for example, be about 0 to 100 degrees Celsius or some other suitable value. A power applied during the dry etching process may, for example, be about 50 to 3000 watts. A bias voltage applied during the dry etching process may, for example, be about 0 to 1200 volts or some other suitable value.

In some embodiments, the first hard mask 1202 may be removed after the second patterning process. For example, the first hard mask 1202 may be removed after the second patterning process by a separate wet etching process or some other suitable process.

Figure 15:
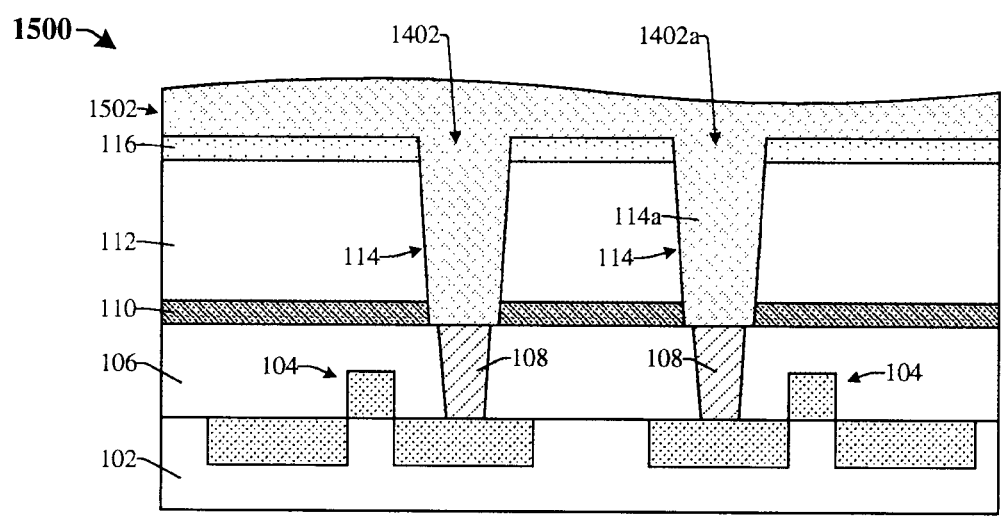

As shown in cross-sectional view 1500 of FIG. 15, a first metal 1502 is deposited over the substrate 102 and in the plurality of lower wire openings 1402 to form a plurality of metal wires 114 in the plurality of lower wire openings 1402. For example, the first metal 1502 is deposited in the first lower wire opening 1402a to form a first metal wire 114a.

The first metal 1502 may, for example, comprise any of tantalum (e.g., Ta), tantalum nitride (e.g., TaN), titanium nitride (e.g., TiN), copper (e.g., Cu), cobalt (e.g., Co), Ruthenium (e.g., Ru), molybdenum (e.g., Mo), iridium (e.g., Ir), tungsten (e.g., W), or some other suitable conductive material, and may be deposited by any of a CVD process, a PVD process, an ALD process, a electrochemical plating (ECP) process, a sputtering process, a spin on process, or some other suitable process. A temperature during the deposition may, for example, be about 20 to 400 degrees Celsius or some other suitable value. A thickness of the plurality of metal wires 114 may, for example, be about 10 to 1000 angstroms or some other suitable value.

As shown in cross-sectional view 1600 of FIG. 16, a planarization process is performed on the first metal 1502 to further define the plurality of metal wires 114. The planarization process may also be performed on the first etch-stop layer 116 such that top surfaces of the first etch-stop layer 116 and top surfaces of the plurality of metal wires 114 are coplanar. The planarization process may, for example, be or comprise a CMP or some other suitable planarization process.

Figure 17:
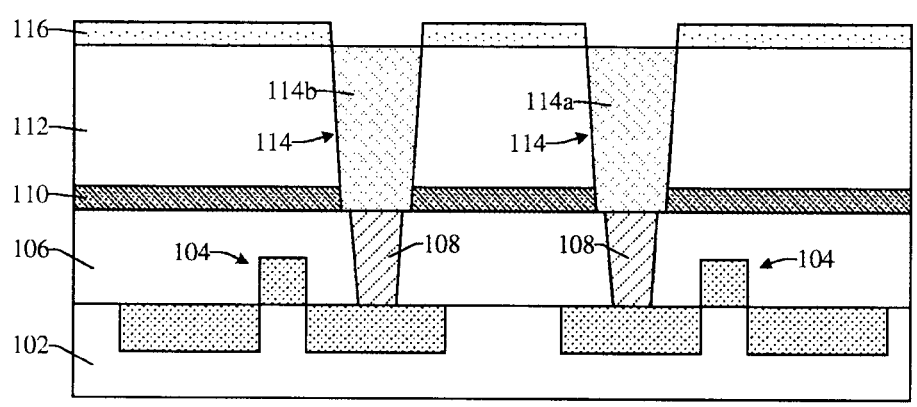

As shown in cross-sectional view 1700 of FIG. 17, the plurality of metal wires 114 are recessed according to the first etch-stop layer 116 (e.g., the first etch-stop layer 116 acts as a mask during the recessing). As a result, top surfaces of the plurality of metal wires 114 are below top surfaces of the first etch-stop layer 116. For example, the first metal wire 114a is recessed such that a top surface of the first metal wire 114a is below top surfaces of the first etch-stop layer 116.

In some embodiments, the top surfaces of the plurality of metal wires 114 are below the top surfaces of the first etch-stop layer 116 and above, or even with, bottom surfaces of the first etch-stop layer 116 after the recessing. In other words, a depth of the recessing may, for example, be less than or approximately equal to a depth of the first etch-stop layer 116. The top surfaces of the plurality of metal wires 114 may be recessed to above or even with the bottom surfaces of the first etch-stop layer 116 so that sidewalls of the first ILD layer 112 are not exposed and/or uncovered after the metal recessing because exposing the sidewalls of the first ILD layer 112 may make the first ILD layer 112 susceptible to damage.

The recessing may, for example, comprise a wet etching process, a dry etching process, or some other suitable etching process. The wet etching process may, for example, utilize any of hydrofluoric acid, phosphoric acid, potassium hydroxide, tetramethylammonium hydroxide, nitric acid, or some other suitable wet etchant. Further, the dry etching process may, for example, comprise an ICP RIE process, a CCP RIE process, a remote plasma etching process, or some other suitable process. The dry etching process may, for example, utilize any of methane (e.g., CH4), fluoromethane (e.g., CH3F), difluoromethane (e.g., CH2F2), trifluoromethane (e.g., CHF3), octafluorocyclobutane (e.g., C4F8), hexafluoro-1,3-butadiene (e.g., C4F6), tetrafluoromethane (e.g., CF4), hydrogen (e.g., H2), hydrogen bromide (e.g., HBr), carbon monoxide (e.g., CO), carbon dioxide (e.g., CO2), oxygen (e.g., O2), boron trichloride (e.g., BCl3), chlorine (e.g., Cl2), nitrogen (e.g., N2), helium (e.g., He), neon (e.g., Ne), argon (e.g., Ar), or some other suitable gas. A pressure applied during the dry etching process may, for example, be about 0.2 to 120 millitorr or some other suitable value. A temperature applied during the dry etching process may, for example, be about 0 to 100 degrees Celsius or some other suitable value. A power applied during the dry etching process may, for example, be about 50 to 3000 watts. A bias voltage applied during the dry etching process may, for example, be about 0 to 1200 volts or some other suitable value.

In some embodiments, the recessing results in the plurality of metal wires 114 having curved upper surfaces (see, for example, FIG. 5). This may be due to the etching process recessing the plurality of metal wires 114 along centers of the plurality of metal wires 114 faster than along edges of the plurality of metal wires 114.

In some other embodiments, the plurality of metal wires 114 are not recessed (see, for example, FIG. 10). As a result, top surfaces of the plurality of metal wires 114 and top surfaces of the first etch-stop layer 116 may be approximately coplanar.

Figure 18:
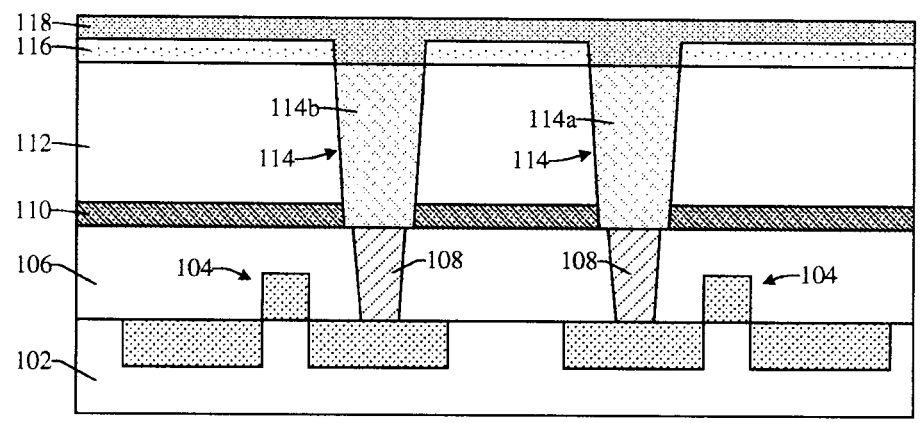

As shown in cross-sectional view 1800 of FIG. 18, a second etch-stop layer 118 is formed over the first etch-stop layer 116, over the plurality of metal wires 114, and between sidewalls of the first etch-stop layer 116. For example, the second etch-stop layer 118 is formed over the first etch-stop layer 116 and over the first metal wire 114a. In some embodiments, the second etch-stop layer 118 is formed on top surfaces of the first etch-stop layer 116 and top surfaces of the plurality of metal wires 114.

The second etch-stop layer 118 may, for example, be formed by depositing any of silicon carbide (e.g., SiC), silicon dioxide (e.g., SiO2), silicon oxycarbide (e.g., SiOC), silicon carbon hydrogen (e.g., SiCH), silicon nitride (e.g., SiN), silicon carbonitride (e.g., SiCN), silicon oxynitride (e.g., SiON), silicon oxycarbonitride (e.g., SiOCN), aluminum oxide (e.g., AlO), aluminum oxynitride (e.g., AlON), aluminum nitride (e.g., AlN), or some other suitable dielectric over the substrate 102 by any of a CVD process, a PVD process, an ALD process, a spin on process, or some other suitable process. A temperature during the deposition may, for example, be about 25 to 400 degrees Celsius or some other suitable value. Further, a thickness of the second etch-stop layer 118 may, for example, be about 10 to 800 angstroms or some other suitable value.

Figure 19:
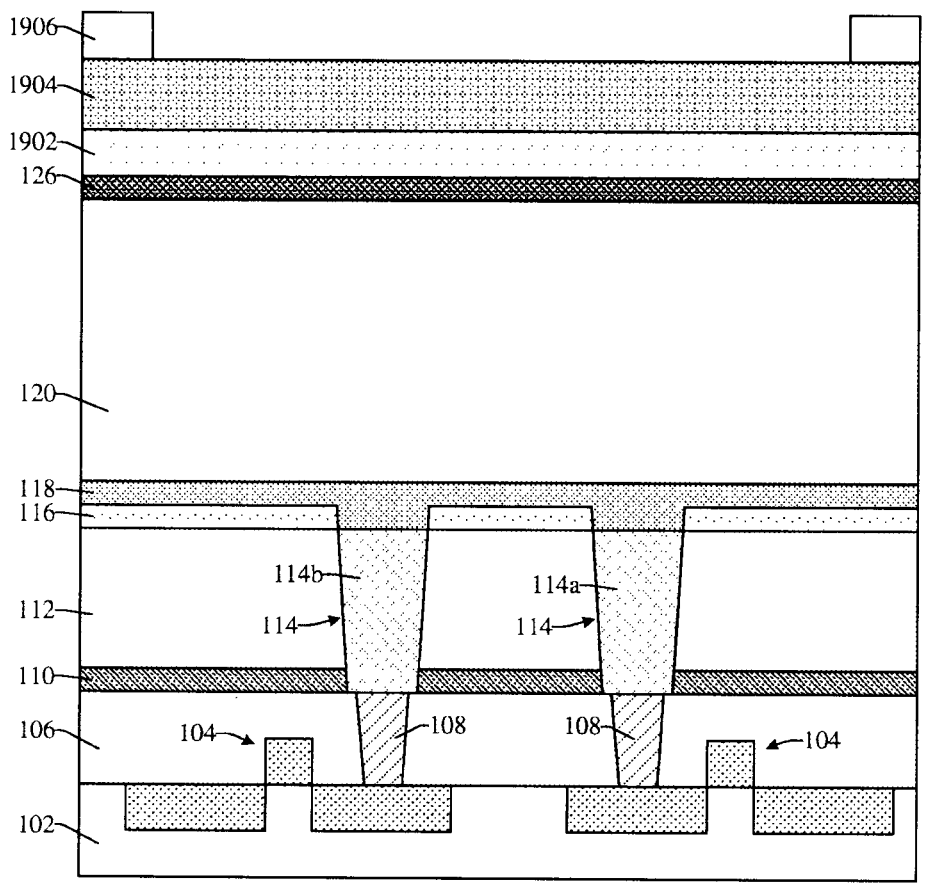

As shown in cross-sectional view 1900 of FIG. 19, a second ILD layer 120 is formed over the second etch-stop layer 118, a third etch-stop layer 126 is formed over the second ILD layer 120, a third hard mask 1902 is formed over the third etch-stop layer 126, a second ARC layer 1904 is formed over the third hard mask 1902, and a second photoresist mask 1906 is formed over the second ARC layer 1904.

The second ILD layer 120 may, for example, be formed by depositing any of silicon carbide (e.g., SiC), silicon dioxide (e.g., SiO2), silicon oxycarbide (e.g., SiOC), silicon carbon hydrogen (e.g., SiCH), silicon nitride (e.g., SiN), silicon carbonitride (e.g., SiCN), silicon oxynitride (e.g., SiON), silicon oxycarbonitride (e.g., SiOCN), aluminum oxide (e.g., AlO), aluminum oxynitride (e.g., AlON), aluminum nitride (e.g., AlN), or some other suitable dielectric over the substrate 102 by any of a CVD process, a PVD process, an ALD process, a spin on process, or some other suitable process. A temperature during the deposition may, for example, be about 25 to 400 degrees Celsius or some other suitable value. Further, a thickness of the second ILD layer 120 may, for example, be about 10 to 800 angstroms or some other suitable value.

The third etch-stop layer 126 may, for example, be formed by depositing any of silicon carbide (e.g., SiC), silicon dioxide (e.g., SiO2), silicon oxycarbide (e.g., SiOC), silicon carbon hydrogen (e.g., SiCH), silicon nitride (e.g., SiN), silicon carbonitride (e.g., SiCN), silicon oxynitride (e.g., SiON), silicon oxycarbonitride (e.g., SiOCN), aluminum oxide (e.g., AlO), aluminum oxynitride (e.g., AlON), aluminum nitride (e.g., AlN), or some other suitable dielectric over the substrate 102 by any of a CVD process, a PVD process, an ALD process, a spin on process, or some other suitable process. A temperature during the deposition may, for example, be about 25 to 400 degrees Celsius or some other suitable value. Further, a thickness of the third etch-stop layer 126 may, for example, be about 10 to 800 angstroms or some other suitable value.

The third hard mask 1902 may, for example, be formed by depositing any of titanium nitride (e.g., TiN), titanium oxide (e.g., TiO), tungsten (e.g., W), tungsten doped carbon (e.g., WdC), hafnium oxide (e.g., HfO), zirconium oxide (e.g., ZrO), zinc oxide (e.g., ZnO), titanium zirconium oxide (e.g., TiZrO), silicon carbide (e.g., SiC), silicon dioxide (e.g., SiO2), silicon oxycarbide (e.g., SiOC), silicon nitride (e.g., SiN), silicon carbonitride (e.g., SiCN), silicon oxynitride (e.g., SiON), silicon oxycarbonitride (e.g., SiOCN), aluminum oxide (e.g., AlO), aluminum oxynitride (e.g., AlON), or some other suitable material over the substrate 102 by any of a CVD process, a PVD process, an ALD process, a spin on process, or some other suitable process. A temperature during the deposition may, for example, be about 50 to 400 degrees Celsius or some other suitable value. Further, a thickness of the third hard mask 1902 may, for example, be about 30 to 500 angstroms or some other suitable value.

The second ARC layer 1904 may, for example, be formed by depositing some organic polymer, some inorganic polymer, or some other suitable material over the substrate 102 by a CVD process, a PVD process, an ALD process, a spin on process, or some other suitable process.

The second photoresist mask 1906 may, for example, be formed by depositing photoresist over the substrate 102 by a CVD process, a PVD process, an ALD process, a spin on process, or some other suitable process, and subsequently developing the photoresist.

Figure 20:
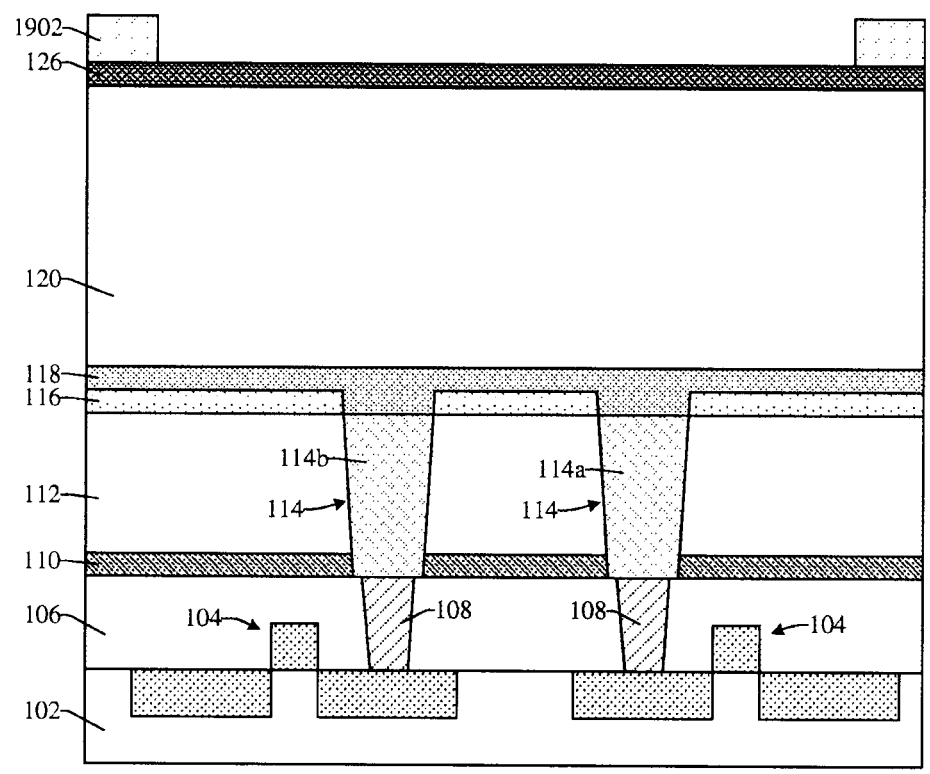

As shown in cross-sectional view 2000 of FIG. 20, the third hard mask 1902 is patterned according to the second photoresist mask (e.g., 1902 of FIG. 19).

The patterning may, for example, comprise an ICP RIE process, a CCP RIE process, or some other suitable process.

Figure 21:
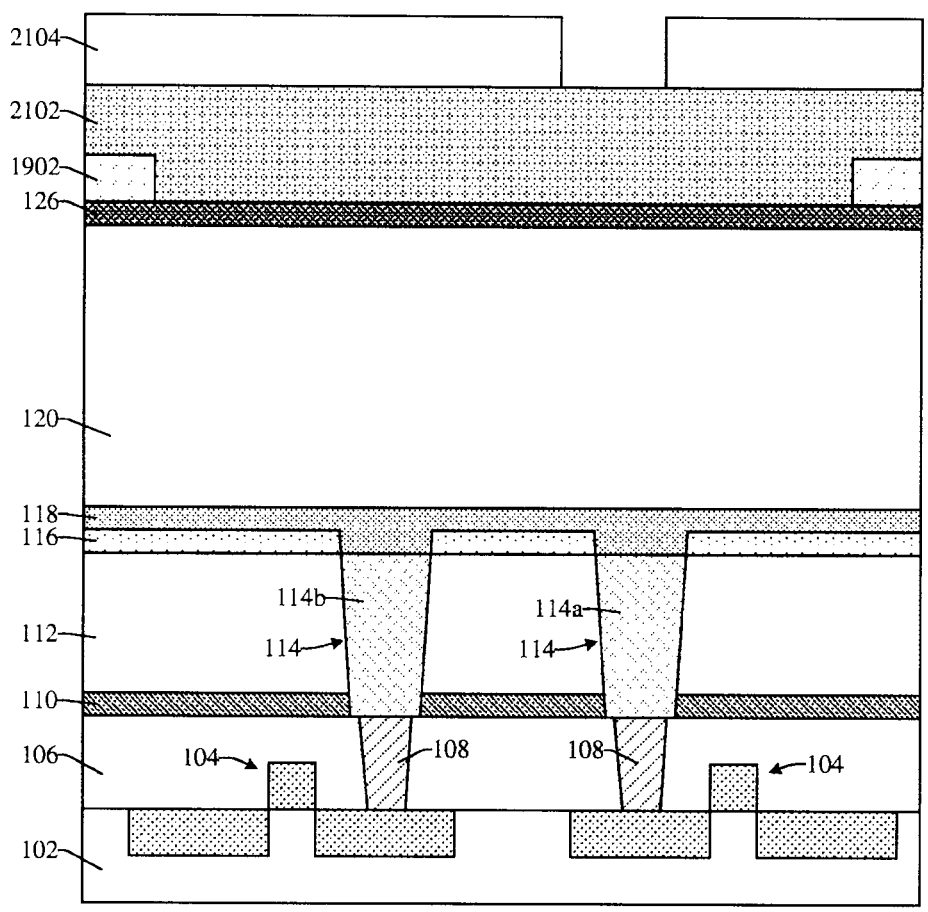

As shown in cross-sectional view 2100 of FIG. 21, a third ARC layer 2102 is formed over the third etch-stop layer 126 and over the third hard mask 1902, and a third photoresist mask 2104 is formed over the third ARC layer 2102.

The third ARC layer 2102 may, for example, be formed by depositing some organic polymer, some inorganic polymer, or some other suitable material over the substrate 102 by a CVD process, a PVD process, an ALD process, a spin on process, or some other suitable process.

The third photoresist mask 2104 may, for example, be formed by depositing photoresist over the substrate 102 by a CVD process, a PVD process, an ALD process, a spin on process, or some other suitable process, and subsequently developing the photoresist.

Figure 22:
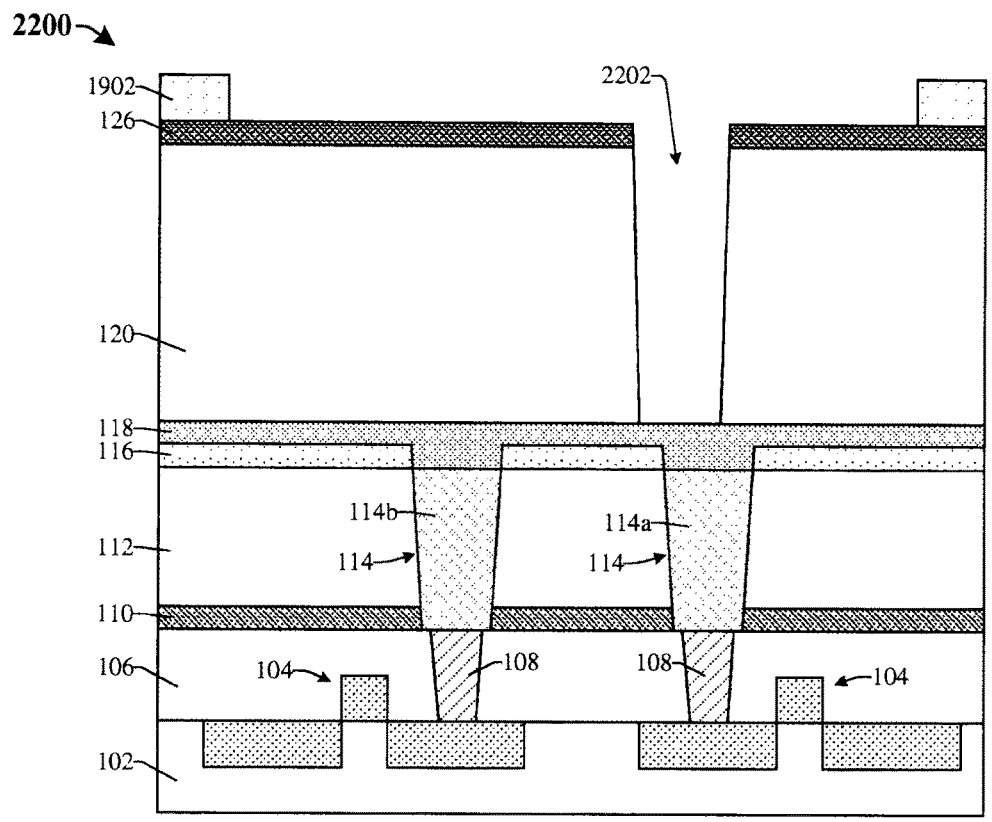

As shown in cross-sectional view 2200 of FIG. 22, the third etch-stop layer 126 and the second ILD layer 120 are patterned according to the third photoresist mask (e.g., 2104 of FIG. 21) to form a via opening 2202 in the third etch-stop layer 126 and in the second ILD layer 120. For example, the via opening 2202 is directly over the first metal wire 114*a* of the plurality of metal wires 114. The via opening 2202 is defined by sidewalls of the third etch-stop layer 126 and sidewalls of the second ILD layer 120.

In some embodiments, a misalignment in the third photoresist mask (e.g., 2104 of FIG. 21) may result in a subsequent misalignment of the via opening 2202. For example, the via opening 2202 may not be aligned with the underlying first metal wire 114*a* (e.g., may be laterally offset from the first metal wire 114*a*), as illustrated in FIG. 22.

In some other embodiments, no misalignment of the third photoresist mask (e.g., 2014 of FIG. 21) may occur and thus the via opening 2202 may be between, or aligned with, sidewalls of the underlying first metal wire 114*a* (see, for example, FIGS. 6, 7, and 8).

The patterning may, for example, comprise a dry etching process or some other suitable etching process. For example, the patterning may comprise an inductively coupled plasma (ICP) reactive ion etching (RIE) process, a conductively coupled plasma (CCP) RIE process, or some other suitable process. The patterning may, for example, utilize any of methane (e.g., CH4), fluoromethane (e.g., CH3F), difluoromethane (e.g., CH2F2), trifluoromethane (e.g., CHF3), octafluorocyclobutane (e.g., C4F8), hexafluoro-1,3-butadiene (e.g., C4F6), tetrafluoromethane (e.g., CF4), hydrogen (e.g., H2), hydrogen bromide (e.g., HBr), carbon monoxide (e.g., CO), carbon dioxide (e.g., CO2), oxygen (e.g., O2), boron trichloride (e.g., BCl3), chlorine (e.g., Cl2), nitrogen (e.g., N2), helium (e.g., He), neon (e.g., Ne), argon (e.g., Ar), or some other suitable gas. A pressure applied during the patterning may, for example, be about 0.2 to 120 millitorr or some other suitable value. A temperature applied during the patterning may, for example, be about 0 to 100 degrees Celsius or some other suitable value. A power applied during the patterning may, for example, be about 50 to 3000 watts. A bias voltage applied during the patterning may, for example, be about 0 to 1200 volts or some other suitable value.

In some embodiments, a width of the via opening 2202 may, for example, about 5 to 300 nanometers or some other suitable value. A height of the via opening 2202 may, for example, be about 50 to 500 angstroms or some other suitable value. Angles between an upper surface of the second etch-stop layer 118 that defines the via opening 2202 and sidewalls of the second ILD layer 120 that define of the via opening 2202 may, for example, be about 40 to 90 degrees or some other suitable value.

Figure 23:
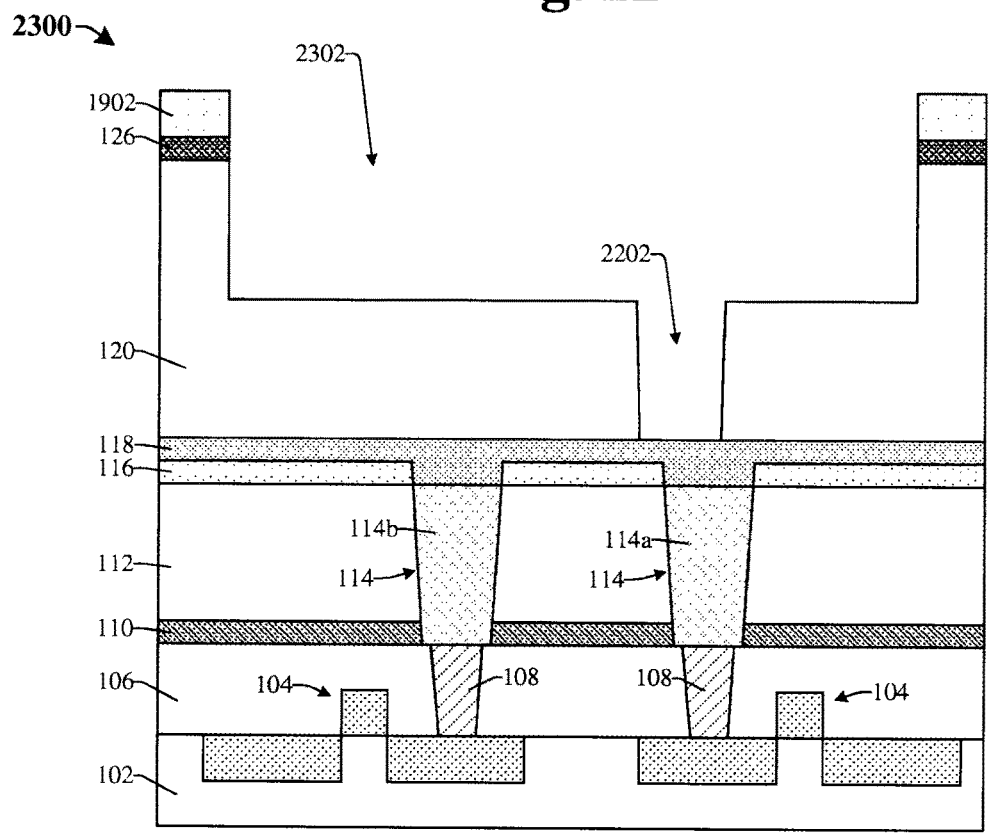

As shown in cross-sectional view 2300 of FIG. 23, the third etch-stop layer 126 and the second ILD layer 120 are patterned according to the third hard mask 1902 to form an upper wire opening 2302 in the third hard mask 1902 and the second ILD layer 120. The upper wire opening 2302 is over the via opening 2202 and is defined by sidewalls of the third etch-stop layer 126, sidewalls of the second ILD layer 120, and one or more lower surfaces of the second ILD layer 120.

The patterning may, for example, comprise a dry etching process or some other suitable etching process. For example, the patterning may comprise an inductively coupled plasma (ICP) reactive ion etching (RIE) process, a conductively coupled plasma (CCP) RIE process, or some other suitable process. The patterning may, for example, utilize any of methane (e.g., CH4), fluoromethane (e.g., CH3F), difluoromethane (e.g., CH2F2), trifluoromethane (e.g., CHF3), octafluorocyclobutane (e.g., C4F8), hexafluoro-1,3-butadiene (e.g., C4F6), tetrafluoromethane (e.g., CF4), hydrogen (e.g., H2), hydrogen bromide (e.g., HBr), carbon monoxide (e.g., CO), carbon dioxide (e.g., CO2), oxygen (e.g., O2), boron trichloride (e.g., BCl3), chlorine (e.g., Cl2), nitrogen (e.g., N2), helium (e.g., He), neon (e.g., Ne), argon (e.g., Ar), or some other suitable gas. A pressure applied during the patterning may, for example, be about 0.2 to 120 millitorr or some other suitable value. A temperature applied during the patterning may, for example, be about 0 to 100 degrees Celsius or some other suitable value. A power applied during the patterning may, for example, be about 50 to 3000 watts. A bias voltage applied during the patterning may, for example, be about 0 to 1200 volts or some other suitable value.

In some embodiments, a width of the upper wire opening 2302 may, for example, about 10 to 300 nanometers or some other suitable value. A height of the upper wire opening 2302 may, for example, be about 50 to 500 angstroms or some other suitable value. Angles between upper surfaces of the second ILD layer 120 that define the upper wire opening 2302 and sidewalls of the second ILD layer 120 that define the upper wire opening 2302 may, for example, be about 50 to 90 degrees or some other suitable value.

Although FIGS. 21-23 illustrate forming the via opening 2202 before forming the upper wire opening 2302, it will be appreciated that in some alternative embodiments, the upper wire opening 2302 may alternatively be formed before the via opening 2202 is formed.

Figure 24:
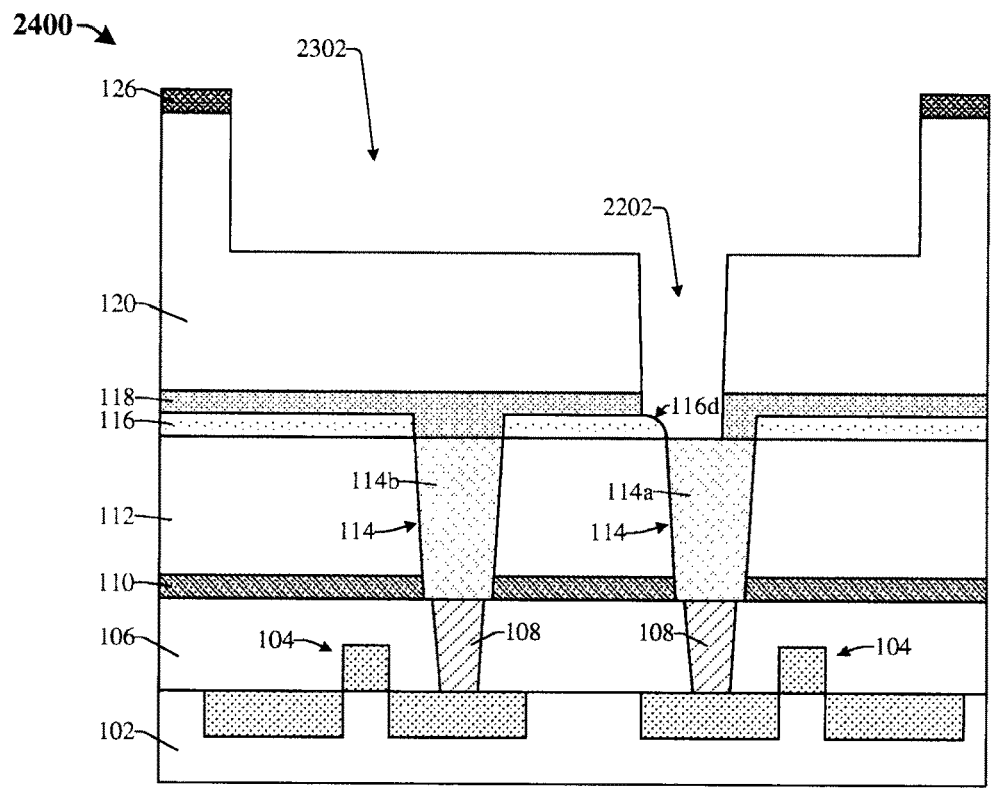

As shown in cross-sectional view 2400 of FIG. 24, the second etch-stop layer 118 is patterned to extend the via opening 2202 into the second etch-stop layer 118 and along the first etch-stop layer 116 to a top surface of the first metal wire 114a. For example, the patterning uncovers the top surface of the first metal wire 114a. The via opening 2202 is defined by sidewalls of the second ILD layer 120, sidewalls of the second etch-stop layer 118, and one or more sidewalls of the first etch-stop layer 116.

In some embodiments, if the via opening 2202 is misaligned with the underlying first metal wire 114a, the patterning may extend through the second etch-stop layer 118 toward the first etch-stop layer 116 and the underlying first ILD layer 112. In such embodiments, the patterning may uncover a top surface of the first etch-stop layer 116. However, the patterning process is highly selective to the second etch-stop layer 118 relative to the first etch-stop layer 116 (e.g., the second etch-stop layer 118 is removed at substantially faster rates than the first etch-stop layer 116). Thus, even in the case of misalignment, the first etch-stop layer 116 may prevent the patterning from damaging the underlying first ILD layer 112. For example, in the case of misalignment, the patterning may modify a portion of the first etch-stop layer 116, as reflected in curved shape of the upper surface 116d of the first etch-stop layer. However, the patterning may not extend through the first etch-stop layer 116 to the underlying first ILD layer 112 because of the selectivity of the patterning.

In contrast, in some other embodiments, if the via opening 2202 is not misaligned with the underlying first metal wire 114a, the patterning may uncover the entire top surface of the first metal wire 114a (see, for example, FIG. 6), or may uncover a portion of the top surface of the first metal wire 114a that is between sidewalls of the first metal wire 114a (see, for example, FIG. 7).

The patterning may, for example, comprise a wet etching process, a dry etching process, or some other suitable etching process. The wet etching process may, for example, utilize any of hydrofluoric acid, phosphoric acid, potassium hydroxide, tetramethylammonium hydroxide, nitric acid, or some other suitable wet etchant. Further, the dry etching process may, for example, comprise an ICP RIE process, a CCP RIE process, a remote plasma etching process, or some other suitable process. The dry etching process may, for example, utilize any of methane (e.g., CH4), fluoromethane (e.g., CH3F), difluoromethane (e.g., CH2F2), trifluoromethane (e.g., CHF3), octafluorocyclobutane (e.g., C4F8), hexafluoro-1,3-butadiene (e.g., C4F6), tetrafluoromethane (e.g., CF4), hydrogen (e.g., H2), hydrogen bromide (e.g., HBr), carbon monoxide (e.g., CO), carbon dioxide (e.g., CO2), oxygen (e.g., O2), boron trichloride (e.g., BCl3), chlorine (e.g., Cl2), nitrogen (e.g., N2), helium (e.g., He), neon (e.g., Ne), argon (e.g., Ar), or some other suitable gas. A pressure applied during the dry etching process may, for example, be about 0.2 to 120 millitorr or some other suitable value. A temperature applied during the dry etching process may, for example, be about 0 to 100 degrees Celsius or some other suitable value. A power applied during the dry etching process may, for example, be about 50 to 3000 watts. A bias voltage applied during the dry etching process may, for example, be about 0 to 1200 volts or some other suitable value.

In some embodiments where the patterning comprises a wet etching process, the second etch-stop layer 118 may have curved sidewalls (see, for example, FIGS. 8 and 9) due to the wet etching process having a lateral component (e.g., due to the wet etching process having an isotropic characteristic).

Further, in some embodiments, the third hard mask 1902 may be removed after the second etch-stop layer 118 is patterned. For example, the third hard mask 1902 may be removed after the second etch-stop layer 118 is patterned by separate a wet etching process or some other suitable process.

Figure 25:
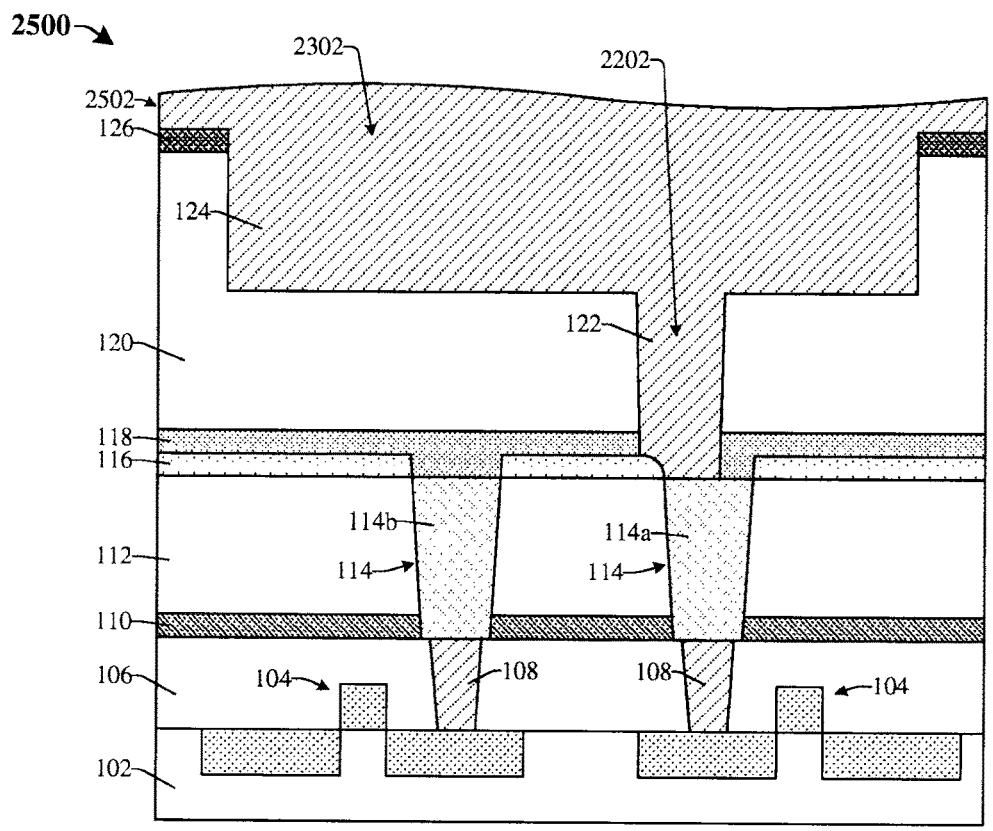

As shown in cross-sectional view 2500 of FIG. 25, a second metal 2502 is deposited over the substrate 102, in the via opening 2202, and in the upper wire opening 2302 to form a metal via 122 and an additional metal wire 124 over the substrate 102. For example, the metal via is directly over the first metal wire 114a. In some embodiments, the metal via 122 is in direct contact with the first metal wire 114a and is electrically connected to the first metal wire 114a.

The second metal 2502 may, for example, comprise any of tantalum (e.g., Ta), tantalum nitride (e.g., TaN), titanium nitride (e.g., TiN), copper (e.g., Cu), cobalt (e.g., Co), Ruthenium (e.g., Ru), molybdenum (e.g., Mo), iridium (e.g., Jr), tungsten (e.g., W), or some other suitable conductive material, and may be deposited by any of a CVD process, a PVD process, an ALD process, a electrochemical plating (ECP) process, a sputtering process, a spin on process, or some other suitable process. A temperature during the deposition may, for example, be about 20 to 400 degrees Celsius or some other suitable value. A thickness of the metal via 122 and/or the additional metal wire 124 may, for example, be about 10 to 1000 angstroms or some other suitable value.

Figure 26:
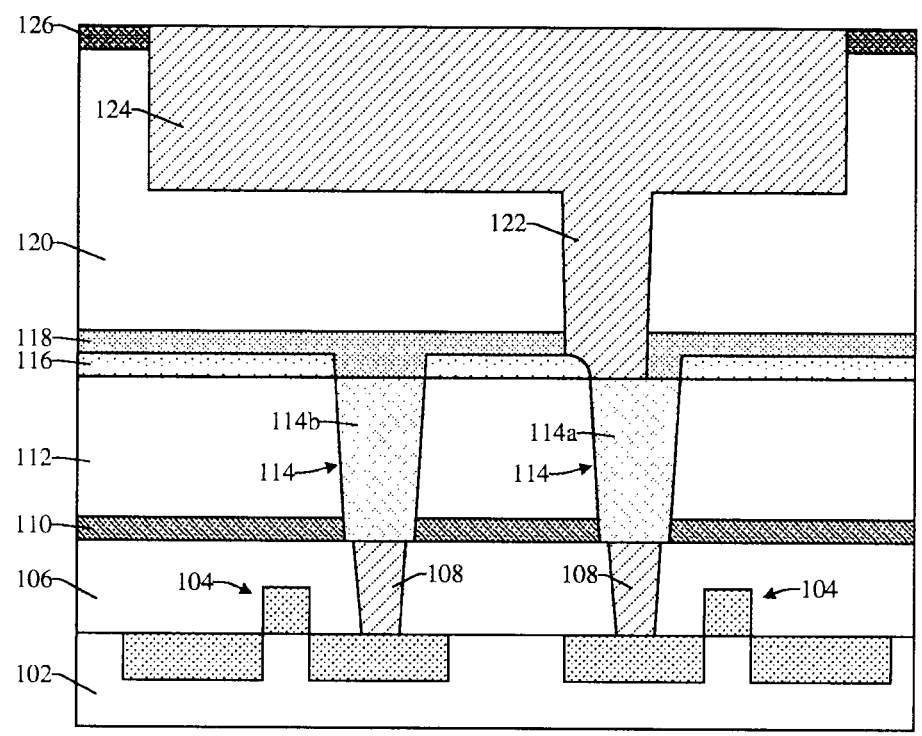

As shown in cross-sectional view 2600 of FIG. 26, a planarization process is performed on the second metal 2502 to further define the additional metal wire 124. The planarization process may also be performed on the third etch-stop layer 126 such that top surfaces of the third etch-stop layer 126 and a top surface of the additional metal wire 124 are coplanar. The planarization process may, for example, be or comprise a CMP or some other suitable planarization process.

Figure 27:
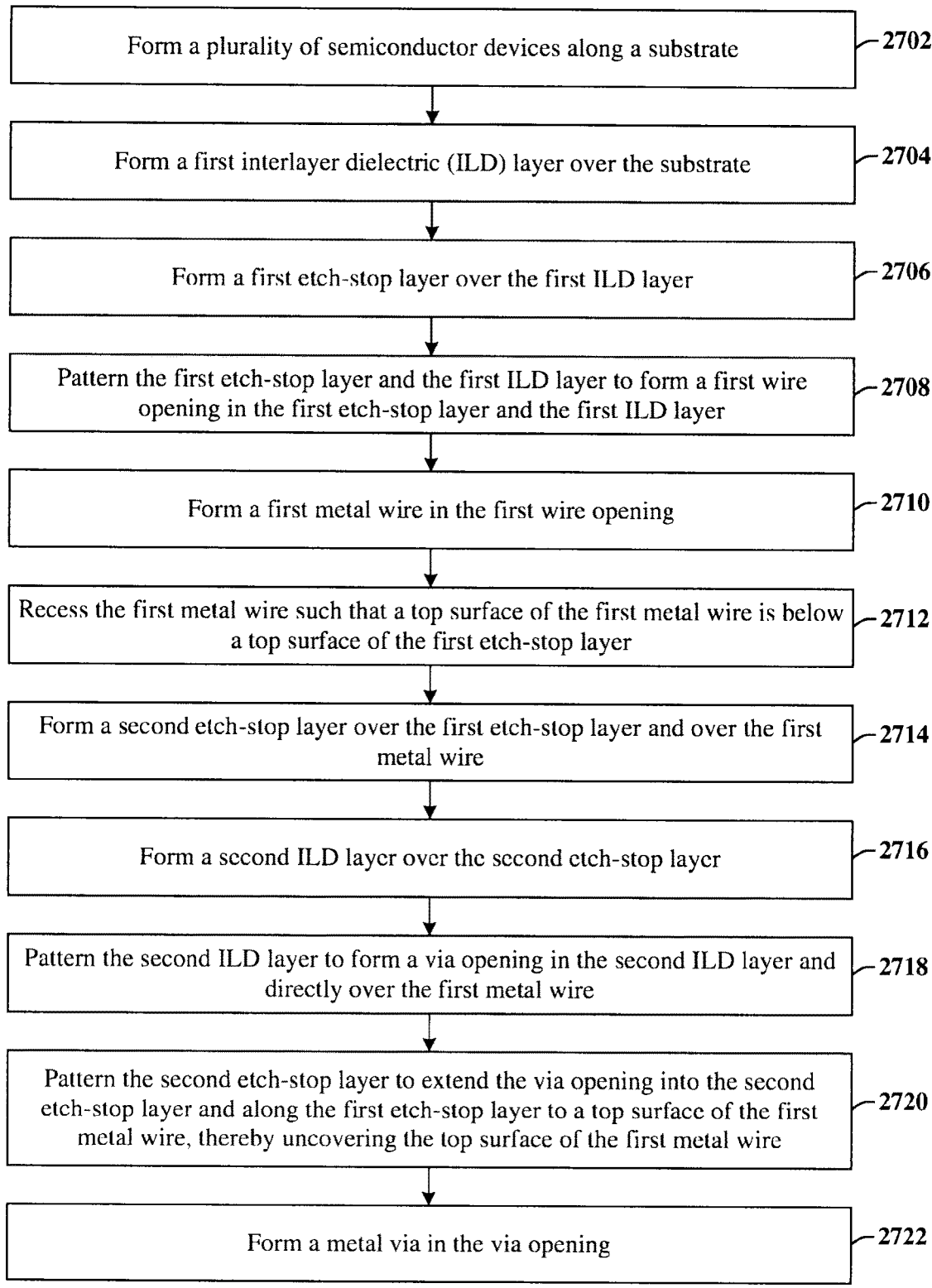
FIG. 27 illustrates a flow diagram of some embodiments of a method for forming an integrated chip comprising a first etch-stop layer and a second etch-stop layer over the first etch-stop layer.

FIG. 27 illustrates a flow diagram of some embodiments of a method 2700 for forming an integrated chip comprising a first etch-stop layer and a second etch-stop layer over the first etch-stop layer. While method 2700 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2702, a plurality of semiconductor devices are formed along a substrate. FIG. 11 illustrates a cross-sectional view 1100 of some embodiments corresponding to act 2702.

At 2704, a first interlayer dielectric (ILD) layer is formed over the substrate. FIG. 12 illustrates a cross-sectional view 1200 of some embodiments corresponding to act 2704.

At 2706, a first etch-stop layer is formed over the first ILD layer. FIG. 12 illustrates a cross-sectional view 1200 of some embodiments corresponding to act 2706.

At 2708, the first etch-stop layer and the first ILD layer are patterned to form a first wire opening in the first etch-stop layer and the first ILD layer. FIG. 14 illustrates a cross-sectional view 1400 of some embodiments corresponding to act 2708.

At 2710, a first metal wire is formed in the first wire opening. FIGS. 15 and 16 illustrate cross-sectional views 1500 and 1600 of some embodiments corresponding to act 2710.

At 2712, the first metal wire is recessed such that a top surface of the first metal wire is below a top surface of the first etch-stop layer. FIG. 17 illustrates a cross-sectional view 1700 of some embodiments corresponding to act 2712.

At 2714, a second etch-stop layer is formed over the first etch-stop layer and over the first metal wire. FIG. 18 illustrates a cross-sectional view 1800 of some embodiments corresponding to act 2714.

At 2716, a second ILD layer is formed over the second etch-stop layer. FIG. 19 illustrates a cross-sectional view 1900 of some embodiments corresponding to act 2716.

At 2718, the second ILD layer is patterned to form a via opening in the second ILD layer and directly over the first metal wire. FIGS. 21 and 22 illustrate cross-sectional views 2100 and 2200 of some embodiments corresponding to act 2718.

At 2720, the second etch-stop layer is patterned to extend the via opening into the second etch-stop layer and along the first etch-stop layer to a top surface of the first metal wire, thereby uncovering the top surface of the first metal wire. FIG. 24 illustrates a cross-sectional view 2400 of some embodiments corresponding to act 2720.

At 2722, a metal via is formed in the via opening. FIGS. 25 and 26 illustrate cross-sectional views 2500 and 2600 of some embodiments corresponding to act 2722.

Thus, the present disclosure relates to an integrated chip comprising a first etch-stop layer and a second etch-stop layer for improving a reliability and performance of the integrated chip.

Accordingly, in some embodiments, the present disclosure relates to an integrated chip comprising a substrate. A first conductive wire is within a first dielectric layer that is over the substrate. A first etch-stop layer is over the first dielectric layer. A second etch-stop layer is over the first etch-stop layer. A conductive via is within a second dielectric layer that is over the second etch-stop layer. The conductive via extends through the second etch-stop layer and along the first etch-stop layer to the first conductive wire. A first lower surface of the second etch-stop layer is on a top surface of the first etch-stop layer. A second lower surface of the second etch-stop layer is on a top surface of the first conductive wire.

In other embodiments, the present disclosure relates to an integrated chip comprising a substrate. A first metal wire is within a first dielectric layer that is over the substrate. A first etch-stop layer is over the first dielectric layer. The first etch-stop layer comprises a first dielectric. A second etch-stop layer is over the first etch-stop layer. The second etch-stop layer comprises a second dielectric different from the first dielectric. A metal via is within a second dielectric layer over the second etch-stop layer. The metal via extends through the second etch-stop layer and along the first etch-stop layer to an upper surface of the first metal wire. The second etch-stop layer is on an upper surface and a sidewall of the first etch-stop layer.

In yet other embodiments, the present disclosure relates to a method for forming an integrated chip. The method comprises forming a first dielectric layer over a substrate. A first etch-stop layer is formed over the first dielectric layer. A first hard mask is formed over the first etch-stop layer. The first etch-stop layer and the first dielectric layer are patterned according to the first hard mask to form a first wire opening in the first etch-stop layer and in the first dielectric layer. The first wire opening is defined by a first pair of sidewalls of the first etch-stop layer and by a second pair of sidewalls of the first dielectric layer. A first metal is deposited in the first wire opening to form a first metal wire. A second etch-stop layer is formed over the first etch-stop layer, over the first metal wire, and between the first pair of sidewalls of the first etch-stop layer. The second etch-stop layer is patterned to form a via opening directly over the first metal wire. A second metal is deposited in the via opening to form a metal via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip comprising:
   a substrate;
   a first dielectric layer over the substrate, the first dielectric layer having a first sidewall and a second sidewall;
   a conductive wire between the first sidewall and the second sidewall of the first dielectric layer;
   a first etch-stop layer over the first dielectric layer, the first etch-stop layer having a first sidewall and a second sidewall;
   a second etch-stop layer over the first etch-stop layer, the second etch-stop layer having a first sidewall and a second sidewall; and
   a conductive via over the conductive wire, the conductive via extending between the first and second sidewalls of the second etch-stop layer and between the first and second sidewalls of the first etch-stop layer,
   wherein the conductive via and the second etch-stop layer extend from the first sidewall of the first etch-stop layer to the second sidewall of the first etch-stop layer below a top surface of the first etch-stop layer.

2. The integrated chip of claim 1, wherein a first sidewall of the conductive via contacts the first sidewall of the first etch-stop layer and a second sidewall of the conductive via contacts the second sidewall of the first etch-stop layer.

3. The integrated chip of claim 2, wherein the conductive via extends directly over the first sidewall of the first etch-stop layer and the second sidewall of the first etch-stop layer.

4. The integrated chip of claim 1, wherein the second etch-stop layer extends along an upper surface of the conductive wire from the first sidewall of the first etch-stop layer to the second sidewall of the first etch-stop layer.

5. The integrated chip of claim 1, further comprising
   a second dielectric layer over the second etch-stop layer, wherein the conductive via extends between a first sidewall and a second sidewall of the second dielectric layer, and wherein an upper surface of the conductive via is on a lower surface of the second dielectric layer.

6. The integrated chip of claim 1, wherein the first sidewall of the second etch-stop layer extends along a first sidewall of the conductive via, wherein the second sidewall of the second etch-stop layer extends along a second sidewall of the conductive via, and wherein the first sidewall of the second etch-stop layer has a greater height than the second sidewall of the second etch-stop layer.

7. The integrated chip of claim 1, wherein the conductive via extends below a bottommost surface of the second etch-stop layer.

8. The integrated chip of claim 1, wherein the first etch-stop layer comprises a first dielectric material and the second etch-stop layer comprises a second dielectric material different from the first dielectric material.

9. An integrated chip comprising:
a substrate;
a dielectric layer over the substrate, the dielectric layer having a first sidewall and a second sidewall;
a conductive wire between the first sidewall and the second sidewall of the dielectric layer;
a first etch-stop layer over the dielectric layer, the first etch-stop layer having a first sidewall and a second sidewall;
a second etch-stop layer over the first etch-stop layer, the second etch-stop layer having a first sidewall and a second sidewall; and
a conductive via over the conductive wire, the conductive via extending between the first and second sidewalls of the second etch-stop layer and between the first and second sidewalls of the first etch-stop layer,
wherein the conductive wire is above a bottom surface of the first etch-stop layer and directly between the first sidewall of the first etch-stop layer and the second sidewall of the first etch-stop layer.

10. The integrated chip of claim 9, wherein the conductive wire extends from the first sidewall of the first etch-stop layer to the second sidewall of the first etch-stop layer.

11. The integrated chip of claim 9, wherein a bottommost surface of the second etch-stop layer extends along a top surface of the first etch-stop layer and a top surface of the conductive wire.

12. The integrated chip of claim 9, wherein the conductive via extends along a sidewall of the conductive wire.

13. The integrated chip of claim 12, wherein the conductive via extends below an upper surface of the conductive wire.

14. The integrated chip of claim 9, wherein the conductive via extends below a bottommost surface of the second etch-stop layer.

15. The integrated chip of claim 9, wherein a top surface of the conductive wire is below a bottom surface of the second etch-stop layer.

16. An integrated chip comprising:
a substrate;
a dielectric layer over the substrate, the dielectric layer having a first sidewall and a second sidewall;
a conductive wire between the first sidewall and the second sidewall of the dielectric layer, the conductive wire having a first sidewall neighboring the first sidewall of the dielectric layer, a second sidewall neighboring the second sidewall of the dielectric layer, and an upper surface extending from the first sidewall of the conductive wire to the second sidewall of the conductive wire;
a first etch-stop layer over the dielectric layer, the first etch-stop layer having a first sidewall and a second sidewall;
a second etch-stop layer over the first etch-stop layer, the second etch-stop layer having a first sidewall and a second sidewall; and
a conductive via over the conductive wire, the conductive via extending between the first and second sidewalls of the second etch-stop layer and between the first and second sidewalls of the first etch-stop layer,
wherein the second etch-stop layer contacts the upper surface of the conductive wire from the first sidewall of the conductive wire to the second sidewall of the conductive wire.

17. The integrated chip of claim 16, wherein the conductive via extends along the upper surface of the conductive wire from the first sidewall of the conductive wire to the second sidewall of the conductive wire.

18. The integrated chip of claim 16, wherein the first and second sidewalls of the first etch-stop layer are directly over the first and second sidewalls of the conductive wire, respectively.

19. The integrated chip of claim 16, wherein the conductive via extends directly over the first sidewall of the conductive wire and the second sidewall of the conductive wire.

20. The integrated chip of claim 16, wherein the second etch-stop layer surrounds the conductive via in a closed path.

* * * * *